(12) United States Patent
Park

(10) Patent No.: US 12,354,705 B2
(45) Date of Patent: Jul. 8, 2025

(54) SEMICONDUCTOR DEVICE AND SEMICONDUCTOR SYSTEM

(71) Applicant: SK hynix Inc., Icheon-si (KR)

(72) Inventor: Joon Hong Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 254 days.

(21) Appl. No.: 18/089,322

(22) Filed: Dec. 27, 2022

(65) Prior Publication Data
US 2024/0071443 A1 Feb. 29, 2024

(30) Foreign Application Priority Data
Aug. 26, 2022 (KR) .......................... 10-2022-0107477

(51) Int. Cl.
G11C 7/22 (2006.01)
G11C 7/10 (2006.01)
(52) U.S. Cl.
CPC ............ *G11C 7/222* (2013.01); *G11C 7/1066* (2013.01); *G11C 7/1093* (2013.01)
(58) Field of Classification Search
CPC ...... G11C 7/222; G11C 7/1066; G11C 7/1093
USPC ......................................... 365/193
See application file for complete search history.

(56) References Cited

U.S. PATENT DOCUMENTS

| 6,674,378 | B2 | 1/2004 | Johnson et al. | |
| 9,324,394 | B2* | 4/2016 | Byun | G11C 7/1093 |
| 9,672,884 | B1* | 6/2017 | Han | G11C 7/1093 |
| 2018/0090190 | A1* | 3/2018 | Hong | G11C 5/147 |
| 2022/0035704 | A1* | 2/2022 | Song | G11C 29/765 |

FOREIGN PATENT DOCUMENTS

KR 1020180126321 A 11/2018

* cited by examiner

*Primary Examiner* — Amir Zarabian
*Assistant Examiner* — Daniel J King
(74) *Attorney, Agent, or Firm* — WILLIAM PARK & ASSOCIATES LTD.

(57) ABSTRACT

A semiconductor device includes a control circuit configured to generate a buffer enable signal that is enabled when patterns of a strobe signal and an inverted strobe signal are preset patterns after the start of a write operation and configured to generate an internal strobe signal by dividing frequencies of an input strobe signal and an inverted input strobe signal, and a buffer circuit configured to generate the input strobe signal and the inverted input strobe signal from the strobe signal and the inverted strobe signal that are received when the buffer enable signal is enabled and configured to generate transfer data by receiving data for performing the write operation when the buffer enable signal is enabled.

26 Claims, 19 Drawing Sheets

SEMICONDUCTOR DEVICE AND SEMICONDUCTOR SYSTEM

CROSS-REFERENCE TO RELATED APPLICATION

The present application claims priority under 35 U.S.C. § 119(a) to Korean application number 10-2022-0107477, filed in the Korean Intellectual Property Office on Aug. 26, 2022, the entire disclosure of which is incorporated herein by reference.

BACKGROUND

The present disclosure relates to a semiconductor device and a semiconductor system that perform a write operation by detecting a pattern of a strobe signal after the start of the write operation.

As the operating speed of a semiconductor system is increased, high-speed data transfer rate is desired between semiconductor devices in a semiconductor system. Various technologies are used for high-speed data transfers between the semiconductor devices. For example, a clock division scheme is used to provide different phases where data can be transmitted using the multi-phase clocks.

In semiconductor devices, a write latency interval for a write operation and a read latency interval for a read operation are set. Write latency is the time from when a command for performing a write operation is received to when data is received. Read latency is the time from when a command for performing a read operation is received to when data is output.

SUMMARY

In an embodiment, a semiconductor device may include a control circuit configured to generate a buffer enable signal that is enabled when patterns of a strobe signal and an inverted strobe signal are preset patterns after the start of a write operation and configured to generate an internal strobe signal by dividing frequencies of an input strobe signal and an inverted input strobe signal, and a buffer circuit configured to generate the input strobe signal and the inverted input strobe signal from the strobe signal and the inverted strobe signal that are received when the buffer enable signal is enabled and configured to generate transfer data by receiving data for performing the write operation when the buffer enable signal is enabled.

In an embodiment, a semiconductor system may include a controller configured to output a strobe signal and an inverted strobe signal after the start of a write operation and configured to output data and a semiconductor device configured to generate a buffer enable signal that is enabled when patterns of the strobe signal and the inverted strobe signal are preset pattern, configured to generate an internal strobe signal by receiving the strobe signal and the inverted strobe signal when the buffer enable signal is enabled, configured to receive the data when the buffer enable signal is enabled, and configured to store the data that is received in synchronization with the internal strobe signal.

In an embodiment, a semiconductor device may include a control circuit configured to generate a buffer enable signal that is enabled when patterns of a strobe signal and an inverted strobe signal are preset pattern after the start of a write operation or that is enabled after the start of a read to write operation and configured to generate an internal strobe signal by dividing frequencies of an input strobe signal and an inverted input strobe signal and a buffer circuit configured to generate the input strobe signal and the inverted input strobe signal from the strobe signal and the inverted strobe signal that are received when the buffer enable signal is enabled and configured to generate transfer data by receiving data for performing the write operation and the read to write operation when the buffer enable signal is enabled.

DETAILED DESCRIPTION

Figure 1:
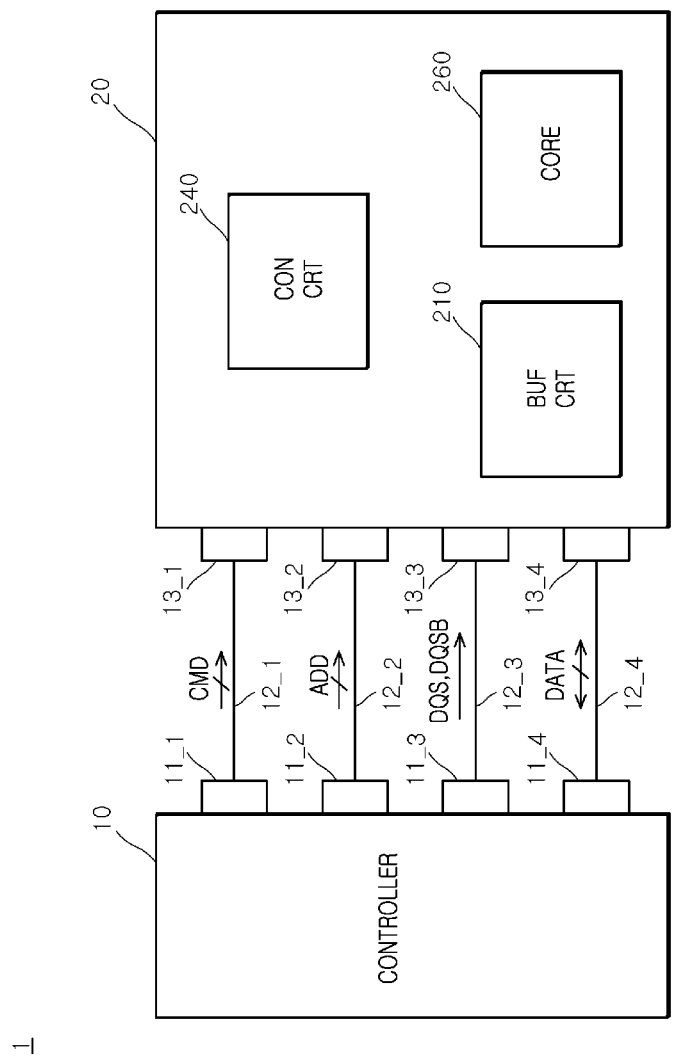
FIG. 1 is a block diagram of an example semiconductor system according to an embodiment of the present disclosure.

In the descriptions of the following embodiments, the term "preset" (or "predetermined") indicates that the value of a parameter is previously set. For example, the parameter may be a received signal, and the value may be voltage levels of the received signal at different times. When a receiving device searches for a specific pattern in the received signal, the received signal may be compared with a preset (or predetermined) signal pattern. The preset signal pattern may be downloaded to the receiving device, loaded by the receiving device from its memory, or "hardwired" or "hardcoded" in the receiving device.

Terms such as "first" and "second" are used to distinguish among various components and do not limit the components. For example, a first component may be referred to as a second component, and vice versa.

When one component is referred to as being "coupled" or "connected" to another component, it should be understood that the components may be directly coupled or connected to each other or coupled or connected to each other through another component interposed in between. On the other hand, when one component is referred to as being "directly coupled" or "directly connected" to another component, it should be understood that the components are directly coupled or connected to each other without another component interposed in between.

A "logic high level" (or a Boolean value of 1) and a "logic low level" (or a Boolean value of 0) are used to describe the logic levels of signals. Two voltages are used to indicate logic high and logic low levels. Generally, the higher voltage is used to indicate a "logic high level," and the lower voltage is used to indicate a "logic low level."

However, two signal systems may be used—an active high system and an active low system. In the active high system, a signal at a "logic high level" corresponds to the higher voltage, and a signal at a "logic low level" corresponds to the lower voltage. These signals may be referred to as active high signals. In the active low system, a signal at a "logic high level" corresponds to the lower voltage, and a signal at a "logic low level" corresponds to the higher voltage. These signals may be referred to as active low signals.

To illustrate the active high and active low systems, an enable signal to a buffer may be asserted to allow a buffer input signal to propagate as a buffer output signal. For a buffer with an active high enable pin, the enable signal at the higher voltage level (active high enable signal) enables the buffer to output the output signal. Accordingly, asserting the active high enable signal sets the signal to the higher voltage level. For a buffer with an active low enable pin, the enable signal at the lower voltage level (an active low enable signal) enables the buffer to output the output signal. Accordingly, asserting the active low enable signal sets the signal to the lower voltage level. Various embodiments may use active low signals and/or active high signals as needed in their designs.

Hereafter, the present disclosure will be described in more detail through embodiments. The embodiments are only used to exemplify the teachings of the present disclosure, and the scope of the present disclosure is not limited by the embodiments.

According to the present disclosure, write latency for a write operation can be reduced by detecting patterns of a strobe signal and an inverted strobe signal.

FIG. 1 is a block diagram of a semiconductor system according to an embodiment of the present disclosure. As illustrated in FIG. 1, a semiconductor system 1 according to an embodiment of the present disclosure may include a controller 10 and a semiconductor device 20. The semiconductor device 20 may include a buffer circuit (BUF CRT) 210, a control circuit (CON CRT) 240, and a core circuit (CORE) 260.

The controller 10 may include a first control pin 11_1, a second control pin 11_2, a third control pin 11_3, and a fourth control pin 11_4. The semiconductor device 20 may include a first device pin 13_1, a second device pin 13_2, a third device pin 13_3, and a fourth device pin 13_4. A first transmission line 12_1 may be connected between the first control pin 11_1 and the first device pin 13_1. A second transmission line 12_2 may be connected between the second control pin 11_2 and the second device pin 13_2. A third transmission line 12_3 may be connected between the third control pin 11_3 and the third device pin 13_3. A fourth transmission line 12_4 may be connected between the fourth control pin 11_4 and the fourth device pin 13_4.

The controller 10 may output a command CMD to the semiconductor device 20 through the first transmission line 12_1. The controller 10 may output an address ADD to the semiconductor device 20 through the second transmission line 12_2. The controller 10 may output a strobe signal DQS and an inverted strobe signal DQSB to the semiconductor device 20 through the third transmission line 12_3. The controller 10 and the semiconductor device 20 may transfer data DATA to each other through the fourth transmission line 12_4. The buffer(s) for transmitting the data DATA may be enabled at appropriate times.

In the semiconductor system 1 according to an embodiment of the present disclosure, in a write operation the data DATA output by the controller 10 may be stored in the semiconductor device 20. After the start of the write operation, the controller 10 may output the strobe signal DQS and the inverted strobe signal DQSB in the form of preset patterns. The preset patterns of the strobe signal DQS and the inverted strobe signal DQSB may be specifically described with reference to FIGS. 9 to 11.

A read operation may output data DATA stored in the semiconductor device 20 to the controller 10.

A read to write operation may be a continuously performed operation comprising a read portion and a write portion. The controller 10 may receive the data DATA during the read portion, and output the data DATA from the semiconductor device 20 for the write portion.

The command CMD and the address ADD may be used to control an operation of the semiconductor device 20. The data DATA may include multiple bits. The strobe signal DQS and the inverted strobe signal DQSB have been illustrated as being output to the semiconductor device 20 through the third transmission line 12_3, but may be implemented as being output to the semiconductor device 20 through different transmission lines. The strobe signal DQS and the inverted strobe signal DQSB may be generated by the controller 10 in the form of preset patterns for performing a write operation.

The buffer circuit 210 may include multiple buffers. The buffer circuit 210 may receive the command CMD, the address ADD, the strobe signal DQS, and the inverted strobe signal DQSB from the controller 10. The buffer circuit 210 may receive the data DATA from the controller 10 or may output the data DATA to the controller 10.

The control circuit 240 may control the buffers in the buffer circuit 210 that receive the various signals from the controller 10.

The core circuit 260 may store data DATA received from the controller 10 in a write operation or output data stored in the core circuit 260 as data DATA to the controller 10 in a read operation.

Figure 2:
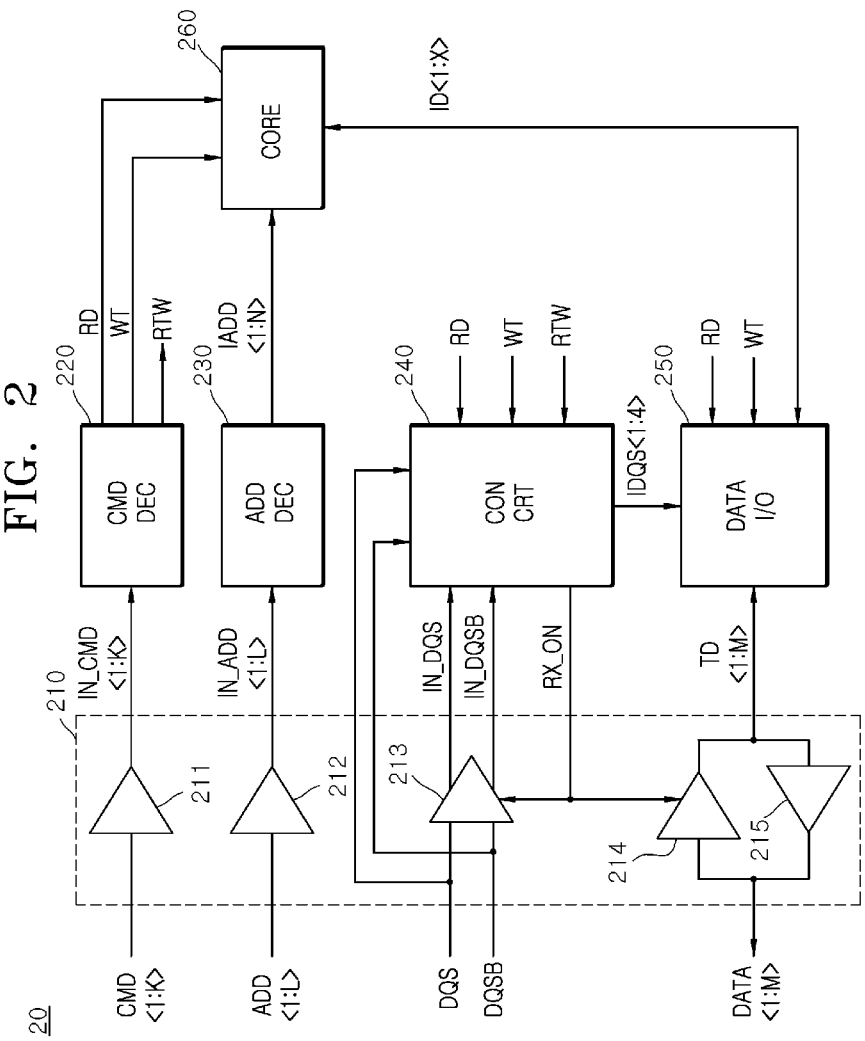
FIG. 2 is a block diagram of an example semiconductor device in the semiconductor system of FIG. 1.

FIG. 2 is a block diagram of an example semiconductor device 20 in the semiconductor system of FIG. 1. As illustrated in FIG. 2, the semiconductor device 20 may include the buffer circuit 210, a command decoder (CMD DEC) 220, an address decoder (ADD DEC) 230, the control circuit 240, a data input/output circuit (DATA I/O) 250, and the core circuit 260.

The buffer circuit 210 may include a first buffer 211, a second buffer 212, a third buffer 213, a fourth buffer 214, and a fifth buffer 215.

The first buffer 211 may generate first to K-th input commands IN_CMD<1:K> by receiving first to K-th commands CMD<1:K>. The first buffer 211 may be implemented as, for example, a single-ended amplifier buffer, and may generate the first to K-th input commands IN_CMD<1:K> by buffering the first to K-th commands CMD<1:K>. The number K of bits of the first to K-th commands CMD<1:K> and the number K of bits of the first to K-th input commands IN_CMD<1:K> may be differently set in different embodiments. In this case, K may be an integer.

The second buffer 212 may generate first to L-th input addresses IN_ADD<1:L> by receiving first to L-th addresses ADD<1:L>. The second buffer 212 may be implemented as a single-ended amplifier buffer, and may generate the first to L-th input addresses IN_ADD<1:L> by buffering the first to L-th addresses ADD<1:L>. The number L of bits of the first to L-th addresses ADD<1:L> and the number L of bits of the first to L-th input addresses IN_ADD<1:L> may be differently set in different embodiments. In this case, L may be an integer.

The third buffer 213 may be turned on when a buffer enable signal RX_ON is enabled. The third buffer 213 may generate an input strobe signal IN_DQS and an inverted input strobe signal IN_DQSB by receiving the strobe signal DQS and the inverted strobe signal DQSB when the buffer enable signal RX_ON is enabled. The third buffer 213 may be implemented as a differential amplifier buffer, and may generate the input strobe signal IN_DQS and the inverted input strobe signal IN_DQSB by differentially amplifying the strobe signal DQS and the inverted strobe signal DQSB when the buffer enable signal RX_ON is enabled.

The fourth buffer 214 may be turned on when the buffer enable signal RX_ON is enabled. The fourth buffer 214 may generate first to M-th transfer data TD<1:M> by receiving first to M-th data DATA<1:M> when the buffer enable signal RX_ON is enabled. The fourth buffer 214 may be implemented as a single-ended amplifier buffer, and may generate the first to M-th transfer data TD<1:M> by buffering the first to M-th data DATA<1:M> when the buffer enable signal RX_ON is enabled. The number M of bits of the first to M-th data DATA<1:M> and the number M of bits of the first to M-th transfer data TD<1:M> may be differently set in different embodiments. In this case, M may be an integer. The first to M-th data DATA<1:M> that are input through the fourth buffer 214 may be input by the controller 10 after the start of a write operation. The first to M-th transfer data TD<1:M> that are output through the fourth buffer 214 may be generated from the first to M-th data DATA<1:M> that are input by the controller 10 after the start of a write operation.

The fifth buffer 215 may generate the first to M-th data DATA<1:M> by receiving the first to M-th transfer data TD<1:M>. The fifth buffer 215 may be implemented as a single-ended amplifier buffer, and may generate the first to M-th data DATA<1:M> by buffering the first to M-th transfer data TD<1:M>. The first to M-th transfer data TD<1:M> that are input through the fifth buffer 215 may be generated from the first to X-th internal data ID<1:X> that are output by the core circuit 260 after the start of a read operation. The number XS of bits of the first to X-th internal data ID<1:X> may be differently set in different embodiments. In this case, X may be an integer. The first to M-th data DATA<1:M> that are output through the fifth buffer 215 may be output to the controller 10 after the start of a read operation.

The command decoder 220 may generate a write signal WT, a read signal RD, and a read to write signal RTW based on the first to K-th input commands IN_CMD<1:K>. The command decoder 220 may generate the write signal WT, the read signal RD, and the read to write signal RTW by decoding the first to K-th input commands IN_CMD<1:K>.

The command decoder 220 may generate the write signal WT that is enabled when the logic levels of the first to K-th input commands IN_CMD<1:K> are input as a logic level combination for performing a write operation. The command decoder 220 may generate the read to write signal RTW that is enabled when the logic levels of the first to K-th input commands IN_CMD<1:K> are input as a logic level combination for performing a write operation continuously after being input as a logic level combination for performing a read operation. The command decoder 220 may generate the read signal RD that is enabled when the logic levels of the first to K-th input commands IN_CMD<1:K> are input as a logic level combination for performing a read operation.

The address decoder 230 may generate first to N-th internal addresses IADD<1:N> based on the first to L-th input addresses IN_ADD<1:L>. The address decoder 230 may generate the first to N-th internal addresses IADD<1:N> by decoding the first to L-th input addresses IN_ADD<1:L>. The first to N-th internal addresses IADD<1:N> may be selectively enabled in order to select multiple memory cells (not illustrated) that are included in the core circuit 260.

The control circuit 240 may generate the buffer enable signal RX_ON by detecting patterns of the strobe signal DQS and the inverted strobe signal DQSB after the start of a write operation. The control circuit 240 may generate the buffer enable signal RX_ON that is enabled when patterns of the strobe signal DQS and the inverted strobe signal DQSB are preset patterns after the start of a write operation. The control circuit 240 may initialize the results of the detection of patterns of the strobe signal DQS and the inverted strobe signal DQSB when the read signal RD is enabled or the write signal WT is disabled.

The control circuit 240 may generate the buffer enable signal RX_ON that is enabled after the start of a read to write operation. The control circuit 240 may generate the buffer enable signal RX_ON based on the read to write signal RTW and the read signal RD after the start of a read to write operation. The control circuit 240 may generate the buffer enable signal RX_ON that is enabled when the read signal RD is disabled for the interval in which the read to write signal RTW is enabled after the start of a read to write operation.

The control circuit 240 may generate first to fourth internal strobe signals IDQS<1:4> by dividing the frequencies of the input strobe signal IN_DQS and the inverted input strobe signal IN_DQSB that are generated from the strobe signal DQS and the inverted strobe signal DQSB.

The data input/output circuit 250 may parallelize and latch the first to M-th transfer data TD<1:M> in synchronization with the first to fourth internal strobe signals IDQS<1:4> after the start of a write operation. The data input/output circuit 250 may generate the first to X-th internal data ID<1:X> from the latched first to M-th transfer data TD<1:M> when the write signal WT is enabled after the start of the write operation. The number M of bits of the first to M-th transfer data TD<1:M> may be variously set in different embodiments. The number X of bits of the first to X-th internal data ID<1:X> may be variously set in different embodiments.

The data input/output circuit 250 may serialize and latch the first to X-th internal data ID<1:X> in synchronization with the first to fourth internal strobe signals IDQS<1:4> after the start of a read to write operation. The data input/output circuit 250 may generate the first to M-th transfer data TD<1:M> based on the latched first to X-th internal data ID<1:X> when the read signal RD is enabled after the start of the read to write operation. The data input/output circuit

250 may parallelize and latch the first to M-th transfer data TD<1:M> in synchronization with the first to fourth internal strobe signals IDQS<1:4> after a read operation is completed, after the start of a read to write operation. The data input/output circuit 250 may generate the first to X-th internal data ID<1:X> from the latched first to M-th transfer data TD<1:M> when the write signal WT is enabled after the start of the read to write operation.

The data input/output circuit 250 may serialize and latch the first to X-th internal data ID<1:X> in synchronization with the first to fourth internal strobe signals IDQS<1:4> after the start of a read operation. The data input/output circuit 250 may generate the first to M-th transfer data TD<1:M> based on the latched first to X-th internal data ID<1:X> when the read signal RD is enabled after the start of the read operation.

The core circuit 260 may store the first to X-th internal data ID<1:X> in a memory cell (not illustrated) that is selected by the first to N-th internal addresses IADD<1:N> when the write signal WT is enabled after the start of a write operation.

The core circuit 260 may output the first to X-th internal data ID<1:X> that have been stored in a memory cell (not illustrated) that is selected by the first to N-th internal addresses IADD<1:N>, when the read signal RD is enabled after the start of a read to write operation. The core circuit 260 may store the first to X-th internal data ID<1:X> in a memory cell (not illustrated) that is selected by the first to N-th internal addresses IADD<1:N>, when the write signal WT is enabled after the start of a read to write operation.

The core circuit 260 may output the first to X-th internal data ID<1:X> that have been stored in a memory cell (not illustrated) that is selected by the first to N-th internal addresses IADD<1:N>, when the read signal RD is enabled after the start of a read operation.

Figure 3:
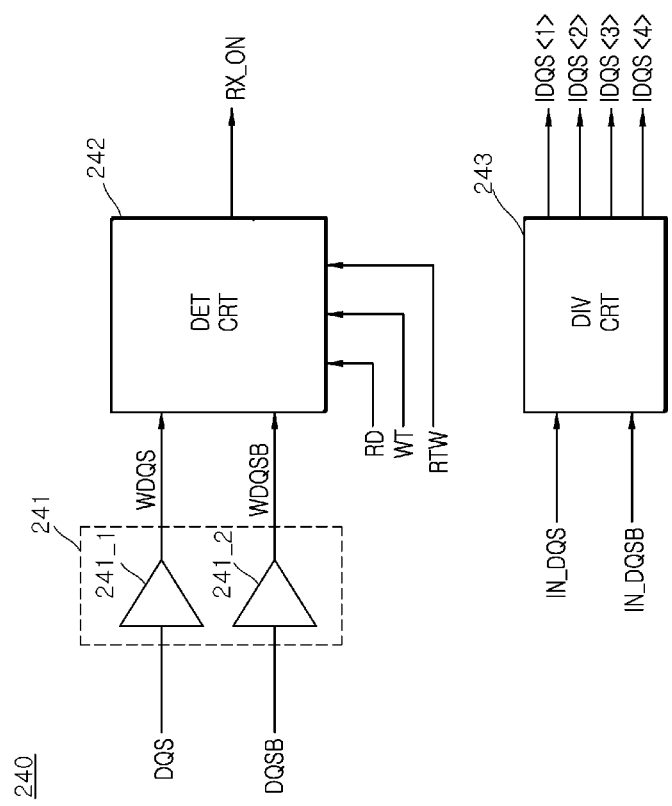
FIG. 3 is a block diagram of an example control circuit in the semiconductor device of FIG. 2.
Figure 4:
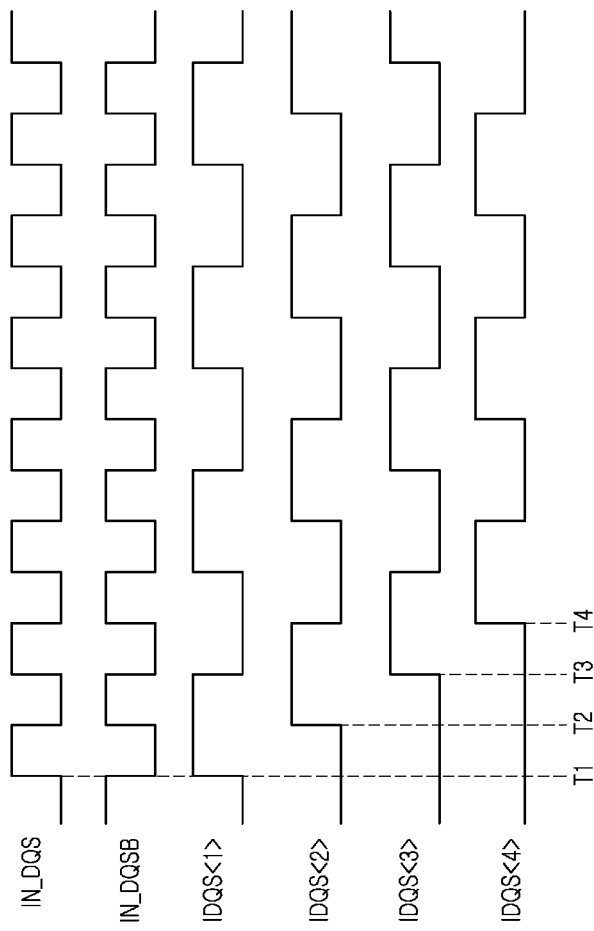
FIG. 4 is a timing diagram for an example division circuit in the control circuit of FIG. 3.

FIG. 3 is a block diagram illustrating a construction according to an embodiment of the control circuit 240. FIG. 4 is timing diagram for describing an operation of a division circuit (DIV CRT) 243 that is included in the control circuit 240 illustrated in FIG. 3. As illustrated in FIG. 3, the control circuit 240 may include an internal buffer circuit 241, a detection circuit (DET CRT) 242, and the division circuit 243.

The internal buffer circuit 241 may include a first internal buffer 241_1 and a second internal buffer 241_2. The first internal buffer 241_1 may generate a write strobe signal WDQS by receiving the strobe signal DQS. The first internal buffer 241_1 may be implemented as a single-ended amplifier buffer, and may generate the write strobe signal WDQS by buffering the strobe signal DQS. The second internal buffer 241_2 may generate an inverted write strobe signal WDQSB by receiving the inverted strobe signal DQSB. The second internal buffer 241_2 may be implemented as a single-ended amplifier buffer, and may generate the inverted write strobe signal WDQSB by buffering the inverted strobe signal DQSB.

The detection circuit 242 may generate the buffer enable signal RX_ON that is enabled when patterns of the write strobe signal WDQS and the inverted write strobe signal WDQSB are preset patterns after the start of a write operation. The detection circuit 242 may initialize the results of the detection of patterns of the write strobe signal WDQS and the inverted write strobe signal WDQSB when the read signal RD is enabled or the write signal WT is disabled. The detection circuit 242 may generate the buffer enable signal RX_ON that is enabled after the start of a read to write operation. The detection circuit 242 may generate the buffer enable signal RX_ON based on the read to write signal RTW and the read signal RD. The detection circuit 242 may generate the buffer enable signal RX_ON that is enabled when the read signal RD is disabled for the interval in which the read to write signal RTW is enabled after the start of a read to write operation.

The division circuit 243 may generate the first to fourth internal strobe signals IDQS<1:4> by dividing the frequencies of the input strobe signal IN_DQS and the inverted input strobe signal IN_DQSB. Each of the frequencies of the generated first to fourth internal strobe signals IDQS<1:4> may be ½ times the frequency of each of the strobe signal DQS and the inverted strobe signal DQSB. The phases of the generated first to fourth internal strobe signals IDQS<1:4> may be different from each other. The frequencies and phases of the first to fourth internal strobe signals IDQS<1:4> are specifically described with reference to FIG. 4.

The frequencies and phases of the first to fourth internal strobe signals IDQS<1:4> that are generated by the division circuit 243 are described as follows with reference FIG. 4 together.

At time T1, the division circuit 243 may generate the first internal strobe signal IDQS<1> by dividing the frequencies of the input strobe signal IN_DQS.

At time T2, the division circuit 243 may generate the second internal strobe signal IDQS<2> by, for example, dividing the frequencies of the input strobe signal IN_DQS and the inverted input strobe signal IN_DQSB. Accordingly, the second internal strobe signal IDQS<2> may be 90 degrees behind the first internal strobe signal IDQS<1>.

At time T3, the division circuit 243 may generate the third internal strobe signal IDQS<3> such that it is 180 degrees out of phase with the first internal strobe signal IDQS<1>. There are many methods to generate this signal. One example method may be to invert the first internal strobe signal IDQS<1>. Another example method may be to use a flip-flop, with the second internal strobe signal IDQS<2> as an input clocked by the input strobe signal IN_DQS. Accordingly, the third internal strobe signal IDQS<3> may be 90 degrees behind the second internal strobe signal IDQS<2>.

At time T4, the division circuit 243 may generate the fourth internal strobe signal IDQS<4> such that it is 180 degrees out of phase with the second inverting internal strobe signal IDQS<2>. There are many methods to generate this signal. One example method may be to invert the second internal strobe signal IDQS<2>. Another example method may be to use a flip-flop, with the third internal strobe signal IDQS<3> as an input clocked by the inverted input strobe signal IN_DQSB. Accordingly, the fourth internal strobe signal IDQS<4> may be 90 degrees behind the third internal strobe signal IDQS<3>.

As illustrated in FIG. 4, each of the first to fourth internal strobe signals IDQS<1:4> may be generated to be half the frequency of the strobe signal DQS and the inverted strobe signal DQSB. Furthermore, the first to fourth internal strobe signals IDQS<1:4> may be generated to have phase differences of 90° with respect to adjacent signals.

Figure 5:
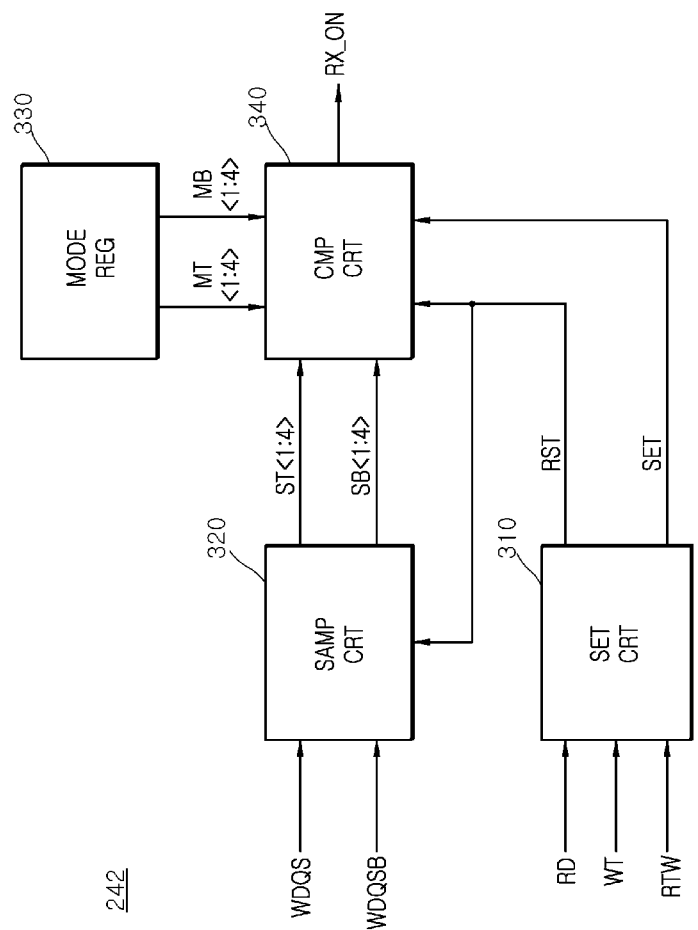
FIG. 5 is a block diagram of an example detection circuit in the control circuit of FIG. 3.

FIG. 5 is a block diagram of an example detection circuit 242 in the control circuit 240 of FIG. 3. As illustrated in FIG. 5, the detection circuit 242 may include a setting circuit (SET CRT) 310, a sampling circuit (SAMP CRT) 320, a mode register (MODE REG) 330, and a comparison circuit (CMP CRT) 340.

The setting circuit 310 may generate a reset signal RST and a set signal SET based on the read signal RD, the write signal WT, and the read to write signal RTW. The setting circuit 310 may generate the reset signal RST that includes a pulse that is generated when the read signal RD is enabled. The setting circuit 310 may generate the reset signal RST that includes a pulse that is generated when the write signal WT is disabled after the write signal WT is enabled. The setting circuit 310 may generate the set signal SET that includes a pulse that is generated when the read signal RD is disabled for the interval in which the read to write signal RTW is enabled.

The sampling circuit 320 may generate first to fourth strobe sampling signals ST<1:4> and first to fourth inverted strobe sampling signals SB<1:4> by sampling the patterns of the write strobe signal WDQS and the inverted write strobe signal WDQSB. The sampling circuit 320 may generate the first to fourth strobe sampling signals ST<1:4> by sequentially sampling the logic levels of the write strobe signal WDQS that are input at rising edges of the inverted write strobe signal WDQSB. The sampling circuit 320 may generate the first to fourth inverted strobe sampling signals SB<1:4> by sequentially sampling the logic levels of the inverted write strobe signal WDQSB that are input at rising edges of the write strobe signal WDQS. The sampling circuit 320 may generate the first to fourth strobe sampling signals ST<1:4> and the first to fourth inverted strobe sampling signals SB<1:4> that are initialized when a pulse of the reset signal RST is input.

The mode register 330 may include multiple registers (not illustrated). The mode register 330 may store first to fourth mode sampling signals MT<1:4> and first to fourth inverted mode sampling signals MB<1:4> that include preset pattern information of the strobe signal DQS and the inverted strobe signal DQSB. The mode register 330 may output the first to fourth mode sampling signals MT<1:4> and the first to fourth inverted mode sampling signals MB<1:4> that have been stored in the mode register 330, after the start of a write operation.

The comparison circuit 340 may generate the buffer enable signal RX_ON by comparing the first to fourth strobe sampling signals ST<1:4> and the first to fourth inverted strobe sampling signals SB<1:4> and the first to fourth mode sampling signals MT<1:4> and the first to fourth inverted mode sampling signals MB<1:4>. The comparison circuit 340 may generate the buffer enable signal RX_ON that is enabled when the first to fourth strobe sampling signals ST<1:4> and the first to fourth mode sampling signals MT<1:4> have the same logic level combination and the first to fourth inverted mode sampling signals MB<1:4> and the first to fourth inverted mode sampling signals MB<1:4> have the same logic level combination. The comparison circuit 340 may generate the buffer enable signal RX_ON that is enabled when a pulse of the set signal SET is input. The comparison circuit 340 may generate the buffer enable signal RX_ON that is disabled when a pulse of the reset signal RST is input.

Figure 6:
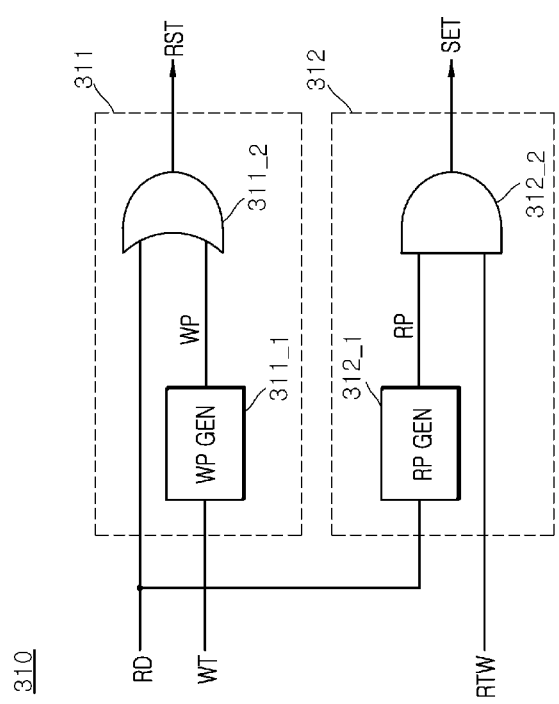
FIG. 6 is a block diagram of an example setting circuit in the detection circuit of FIG. 5.

FIG. 6 is a diagram illustrating a construction according to an embodiment of the setting circuit 310. As illustrated in FIG. 6, the setting circuit 310 may include a reset signal generation circuit 311 and a set signal generation circuit 312.

The reset signal generation circuit 311 may include a write pulse generator (WP GEN) 311_1 and an OR gate 311_2. The write pulse generator 311_1 may generate a write pulse WP that includes a pulse that is generated when the write signal WT is disabled after being enabled. The write pulse generator 311_1 may generate the write pulse WP that includes a pulse having a logic high level when the logic level of the write signal WT transitions to a logic low level after being input as a logic high level. The OR gate 311_2 may generate the reset signal RST the logic level of which is enabled to a logic high level, when the logic level of any one of the read signal RD and the write pulse WP is generated as a logic high level. The OR gate 311_2 may generate the reset signal RST by performing an OR operation on the read signal RD and the write pulse WP.

The set signal generation circuit 312 may include a read pulse generator (RP GEN) 312_1 and an AND gate 312_2. The read pulse generator 312_1 may generate the read pulse RP that includes a pulse that is generated when the read signal RD is disabled after being enabled. The read pulse generator 312_1 may generate the read pulse RP that includes a pulse having a logic high level when the logic level of the read signal RD transitions to a logic low level after being input as a logic high level. The AND gate 312_2 may generate the set signal SET the logic level of which is enabled to a logic high level when the logic level of the read pulse RP is generated as a logic high level for the interval in which the logic level of the read to write signal RTW is enabled to a logic high level. The AND gate 312_2 may generate the set signal SET by performing an AND operation on the read to write signal RTW and the read pulse RP.

Figure 7:
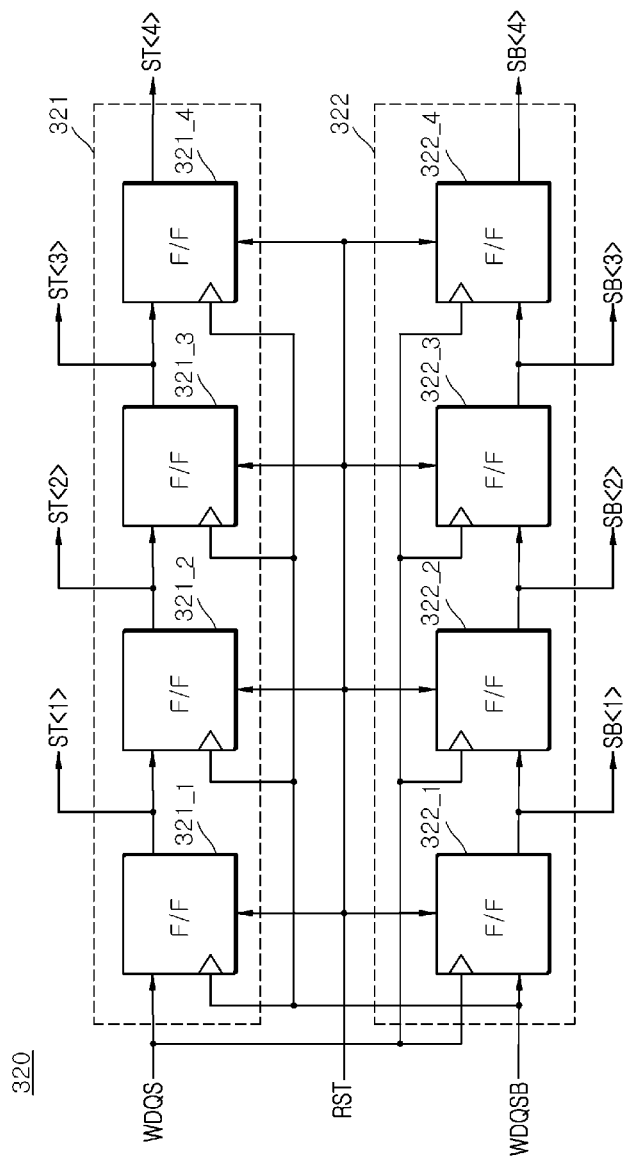
FIG. 7 is a block diagram of an example sampling circuit in the detection circuit of FIG. 5.

FIG. 7 is a block diagram illustrating a construction according to an embodiment of the sampling circuit 320. As illustrated in FIG. 7, the sampling circuit 320 may include a strobe sampling signal generation circuit 321 and an inverted strobe sampling signal generation circuit 322.

The strobe sampling signal generation circuit 321 may be implemented as flip-flops 321_1, 321_2, 321_3, and 321_4. The flip-flop 321_1 may generate the first strobe sampling signal ST<1> by sampling the logic level of the write strobe signal WDQS that is input at a rising edge of the inverted write strobe signal WDQSB. The flip-flop 321_1 may generate the first strobe sampling signal ST<1> the logic level of which is initialized to a logic low level when the logic level of the reset signal RST is input as a logic high level. The flip-flop 321_2 may generate the second strobe sampling signal ST<2> by sampling the logic level of the first strobe sampling signal ST<1> that is input at a rising edge of the inverted write strobe signal WDQSB. The flip-flop 321_2 may generate the second strobe sampling signal ST<2> the logic level of which is initialized to a logic low level when the logic level of the reset signal RST is input as a logic high level. The flip-flop 321_3 may generate the third strobe sampling signal ST<3> by sampling the logic level of the second strobe sampling signal ST<2> that is input at a rising edge of the inverted write strobe signal WDQSB. The flip-flop 321_3 may generate the third strobe sampling signal ST<3> the logic level of which is initialized to a logic low level when the logic level of the reset signal RST is input as a logic high level. The flip-flop 321_4 may generate the fourth strobe sampling signal ST<4> by sampling the logic level of the third strobe sampling signal ST<3> that is input at a rising edge of the inverted write strobe signal WDQSB. The flip-flop 321_4 may generate the fourth strobe sampling signal ST<4> the logic level of which is initialized to a logic low level when the logic level of the reset signal RST is input as a logic high level.

The strobe sampling signal generation circuit 321 may generate the first to fourth strobe sampling signals ST<1:4> by sequentially sampling the logic levels of the write strobe signal WDQS that is input in synchronization with the inverted write strobe signal WDQSB. The strobe sampling signal generation circuit 321 may generate the first to fourth strobe sampling signals ST<1:4> the logic levels of all the bits of which are initialized to a logic low level when the logic level of the reset signal RST is input as a logic high level.

The inverted strobe sampling signal generation circuit 322 may be implemented as flip-flops 322_1, 322_2, 322_3, and 322_4. The flip-flop 322_1 may generate the first inverted strobe sampling signal SB<1> by sampling the logic level of the inverted write strobe signal WDQSB that is input at a rising edge of the write strobe signal WDQS. The flip-flop 322_1 may generate the first inverted strobe sampling signal SB<1> the logic level of which is initialized to a logic low level when the logic level of the reset signal RST is input as a logic high level. The flip-flop 322_2 may generate the second inverted strobe sampling signal SB<2> by sampling the logic level of the first inverted strobe sampling signal SB<1> that is input at a rising edge of the write strobe signal WDQS. The flip-flop 322_2 may generate the second inverted strobe sampling signal SB<2> the logic level of which is initialized to a logic low level when the logic level of the reset signal RST is input as a logic high level. The flip-flop 322_3 may generate the third inverted strobe sampling signal SB<3> by sampling the logic level of the second inverted strobe sampling signal SB<2> that is input at a rising edge of the write strobe signal WDQS. The flip-flop 322_3 may generate the third inverted strobe sampling signal SB<3> the logic level of which is initialized to a logic low level when the logic level of the reset signal RST is input as a logic high level. The flip-flop 322_4 may generate the fourth inverted strobe sampling signal SB<4> by sampling the logic level of the third inverted strobe sampling signal SB<3> that is input at a rising edge of the write strobe signal WDQS. The flip-flop 322_4 may generate the fourth inverted strobe sampling signal SB<4> the logic level of which is initialized to a logic low level when the logic level of the reset signal RST is input as a logic high level.

The inverted strobe sampling signal generation circuit 322 may generate the first to fourth inverted strobe sampling signals SB<1:4> by sequentially sampling the logic levels of the inverted write strobe signal WDQSB that is input in synchronization with the write strobe signal WDQS. The inverted strobe sampling signal generation circuit 322 may generate the first to fourth inverted strobe sampling signals SB<1:4> the logic levels of all the bits of which are initialized to a logic low level when the logic level of the reset signal RST is input as a logic high level.

Figure 8:
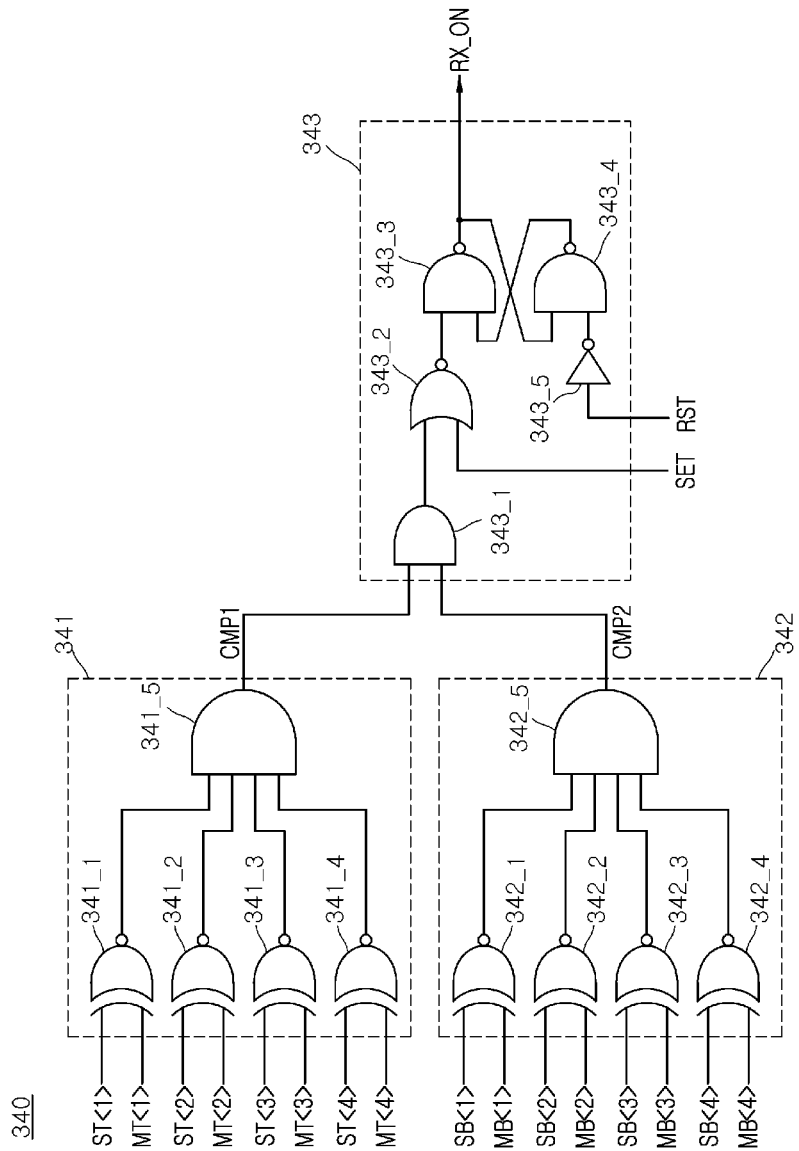
FIG. 8 is a circuit diagram of an example comparison circuit in the detection circuit of FIG. 5.
Figure 9:
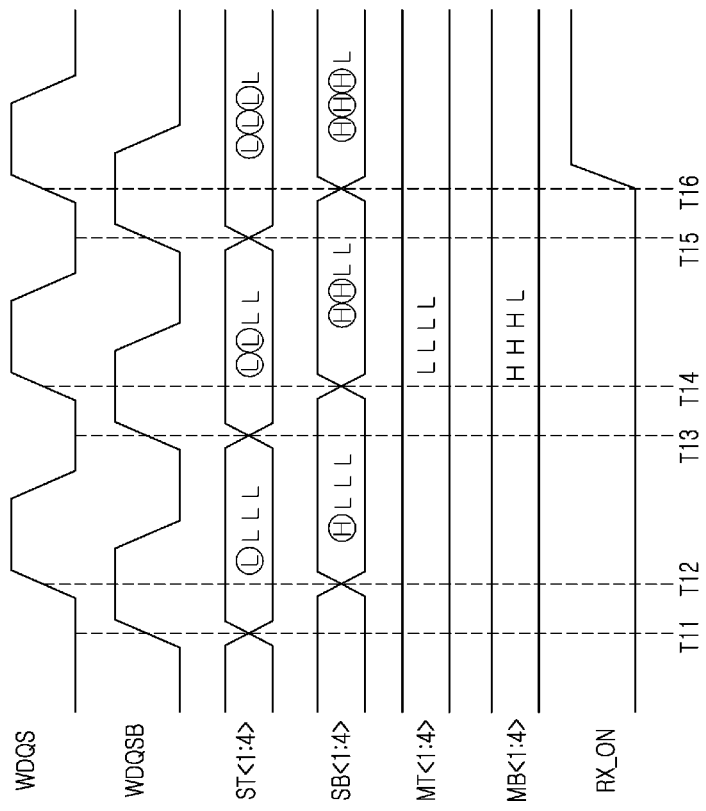
FIGS. 9 to 11 are timing diagrams of example operations of the detection circuit of FIG. 5.
Figure 10:
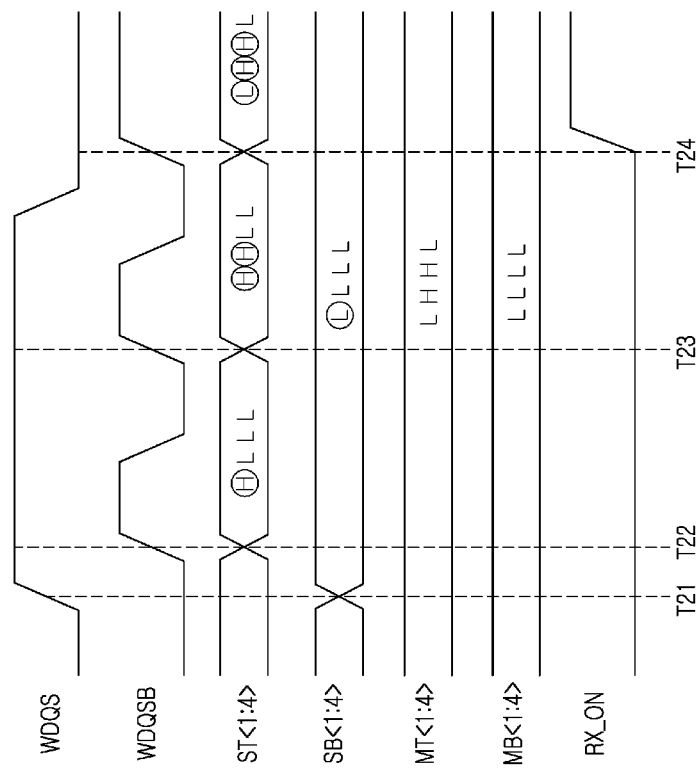
Figure 11:
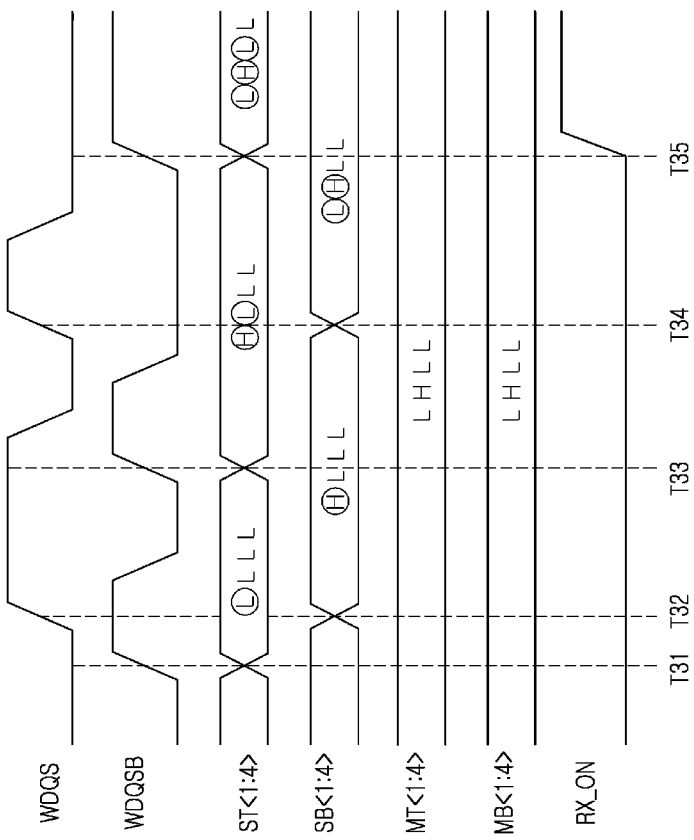

FIG. 8 is a circuit diagram illustrating a construction according to an embodiment of the comparison circuit 340. FIGS. 9 to 11 are timing diagrams for describing an operation according to an embodiment of the detection circuit 242. As illustrated in FIG. 8, the comparison circuit 340 may include a first comparison signal generation circuit 341, a second comparison signal generation circuit 342, and a buffer enable signal generation circuit 343.

The first comparison signal generation circuit 341 may include exclusive NOR gates 341_1, 341_2, 341_3, 341_4, and an AND gate 341_5. The first comparison signal generation circuit 341 may generate a first comparison signal CMP1 by comparing logic level combinations of the first to fourth strobe sampling signals ST<1:4> and the first to fourth mode sampling signals MT<1:4>. The first comparison signal generation circuit 341 may generate the first comparison signal CMP1 having a logic high level when both the bits of the first to fourth strobe sampling signals ST<1:4> and the bits of the first to fourth mode sampling signals MT<1:4> have the same logic level combinations.

The second comparison signal generation circuit 342 may include exclusive NOR gates 342_1, 342_2, 342_3, 342_4, and an AND gate 342_5. The second comparison signal generation circuit 342 may generate a second comparison signal CMP2 by comparing logic level combinations of the first to fourth inverted strobe sampling signals SB<1:4> and the first to fourth inverted mode sampling signals MB<1:4>. The second comparison signal generation circuit 342 may generate the second comparison signal CMP2 having a logic high level when both the bits of the first to fourth inverted strobe sampling signals SB<1:4> and the bits of the first to fourth inverted mode sampling signals MB<1:4> have the same logic level combination.

The buffer enable signal generation circuit 343 may include an AND gate 343_1, a NOR gate 343_2, NAND gates 343_3 and 343_4, and an inverter 343_5. The NAND gates 343_3 and 343_4 may implement an SR latch. The buffer enable signal generation circuit 343 may generate the buffer enable signal RX_ON based on the first comparison signal CMP1, the second comparison signal CMP2, the set signal SET, and the reset signal RST. The buffer enable signal generation circuit 343 may generate the buffer enable signal RX_ON the logic level of which is enabled to a logic high level when both the logic levels of the first comparison signal CMP1 and the second comparison signal CMP2 are enabled to a logic high level.

The buffer enable signal generation circuit 343 may generate the buffer enable signal RX_ON the logic level of which is enabled to a logic high level when the logic level of the set signal SET is enabled to a logic high level. The buffer enable signal generation circuit 343 may generate the buffer enable signal RX_ON the logic level of which is disabled to a logic low level when the logic level of the reset signal RST is enabled to a logic high level.

A first embodiment in which the detection circuit 242 of the present disclosure generates the buffer enable signal RX_ON by detecting preset patterns of the write strobe signal WDQS and the inverted write strobe signal WDQSB that are generated from the strobe signal DQS and the inverted strobe signal DQSB is described as follows with reference to FIG. 9 together.

Prior to the description, the first to fourth mode sampling signals MT<1:4> having a preset pattern are set as "L, L, L, L", and the first to fourth inverted mode sampling signals MB<1:4> having a preset pattern are set as "H, H, H, L."

At time T11, the strobe sampling signal generation circuit 321 may generate the first strobe sampling signal ST<1> having a logic low level L by sampling the logic level of the write strobe signal WDQS that is input at a rising edge of the inverted write strobe signal WDQSB.

At time T12, the inverted strobe sampling signal generation circuit 322 may generate the first inverted strobe sampling signal SB<1> having a logic high level H by sampling the logic level of the inverted write strobe signal WDQSB that is input at a rising edge of the write strobe signal WDQS.

At time T13, the strobe sampling signal generation circuit 321 may generate the first strobe sampling signal ST<1> having a logic low level L and the second strobe sampling signal ST<2> having a logic low level L by sampling the logic level of the write strobe signal WDQS that is input at a rising edge of the inverted write strobe signal WDQSB.

At time T14, the inverted strobe sampling signal generation circuit 322 may generate the first inverted strobe sampling signal SB<1> having a logic high level H and the second inverted strobe sampling signal SB<2> having a logic high level H by sampling the logic level of the inverted write strobe signal WDQSB that is input at a rising edge of the write strobe signal WDQS.

At time T15, the strobe sampling signal generation circuit 321 may generate the first strobe sampling signal ST<1> having a logic low level L, the second strobe sampling signal ST<2> having a logic low level L, and the third strobe sampling signal ST<3> having a logic low level L by sampling the logic level of the write strobe signal WDQS that is input at a rising edge of the inverted write strobe signal WDQSB.

At time T16, the inverted strobe sampling signal generation circuit 322 may generate the first inverted strobe sampling signal SB<1> having a logic high level H, the second inverted strobe sampling signal SB<2> having a logic high level H, and the third inverted strobe sampling signal SB<3> having a logic high level H by sampling the logic level of the inverted write strobe signal WDQSB that is input at a rising edge of the write strobe signal WDQS.

At this time, the comparison circuit 340 may generate the buffer enable signal RX_ON the logic level of which is enabled to a logic high level because the first to fourth strobe sampling signals ST<1:4> and the first to fourth mode sampling signals MT<1:4> have the same logic level combination and the first to fourth inverted strobe sampling signals SB<1:4> and the first to fourth inverted mode sampling signals MB<1:4> have the same logic level combination.

A second embodiment in which the detection circuit 242 of the present disclosure generates the buffer enable signal RX_ON by detecting preset patterns of the write strobe signal WDQS and the inverted write strobe signal WDQSB that are generated from the strobe signal DQS and the inverted strobe signal DQSB is described as follows with reference to FIG. 10.

Prior to the description, the first to fourth mode sampling signals MT<1:4> having a preset pattern are set as "L, H, H, L", and the first to fourth inverted mode sampling signals MB<1:4> having a preset pattern are set as "L, L, L, L."

At time T21, the inverted strobe sampling signal generation circuit 322 may generate the first inverted strobe sampling signal SB<1> having a logic low level L by sampling the logic level of the inverted write strobe signal WDQSB that is input at a rising edge of the write strobe signal WDQS.

At time T22, the strobe sampling signal generation circuit 321 may generate the first strobe sampling signal ST<1> having a logic high level H by sampling the logic level of the write strobe signal WDQS that is input at a rising edge of the inverted write strobe signal WDQSB.

At time T23, the strobe sampling signal generation circuit 321 may generate the first strobe sampling signal ST<1> having a logic high level H and the second strobe sampling signal ST<2> having a logic high level H by sampling the logic level of the write strobe signal WDQS that is input at a rising edge of the inverted write strobe signal WDQSB.

At time T24, the strobe sampling signal generation circuit 321 may generate the first strobe sampling signal ST<1> having a logic low level L, the second strobe sampling signal ST<2> having a logic high level H, and the third strobe sampling signal ST<3> a logic high level H by sampling the logic level of the write strobe signal WDQS that is input at a rising edge of the inverted write strobe signal WDQSB.

At this time, the comparison circuit 340 may generate the buffer enable signal RX_ON the logic level of which is enabled to a logic high level because the first to fourth strobe sampling signals ST<1:4> have the same logic level combination as the first to fourth mode sampling signals MT<1:4> and the first to fourth inverted strobe sampling signals SB<1:4> have the same logic level combination as the first to fourth inverted mode sampling signals MB<1:4>.

A third embodiment in which the detection circuit 242 of the present disclosure generates the buffer enable signal RX_ON by detecting preset patterns of the write strobe signal WDQS and the inverted write strobe signal WDQSB that are generated from the strobe signal DQS and the inverted strobe signal DQSB is described as follows with reference to FIG. 11.

The first to fourth mode sampling signals MT<1:4> may have a preset pattern of "L, H, L, L", and the first to fourth inverted mode sampling signals MB<1:4> may have a preset pattern of "L, H, L, L."

At time T31, the strobe sampling signal generation circuit 321 may generate the first strobe sampling signal ST<1> having a logic low level L by sampling the logic level of the write strobe signal WDQS that is input at a rising edge of the inverted write strobe signal WDQSB.

At time T32, the inverted strobe sampling signal generation circuit 322 may generate the first inverted strobe sampling signal SB<1> having a logic high level H by sampling the logic level of the inverted write strobe signal WDQSB that is input at a rising edge of the write strobe signal WDQS.

At time T33, the strobe sampling signal generation circuit 321 may generate the first strobe sampling signal ST<1> having a logic high level H and the second strobe sampling signal ST<2> having a logic low level L by sampling the logic level of the write strobe signal WDQS that is input at a rising edge of the inverted write strobe signal WDQSB.

At time T34, the inverted strobe sampling signal generation circuit 322 may generate the first inverted strobe sampling signal SB<1> having a logic low level L and the second inverted strobe sampling signal SB<2> having a logic high level H by sampling the logic level of the inverted write strobe signal WDQSB that is input at a rising edge of the write strobe signal WDQS.

At time T35, the strobe sampling signal generation circuit 321 may generate the first strobe sampling signal ST<1> having a logic low level L, the second strobe sampling signal ST<2> having a logic high level H, and the third strobe sampling signal ST<3> having a logic low level L by sampling the logic level of the write strobe signal WDQS that is input at a rising edge of the inverted write strobe signal WDQSB.

At this time, the comparison circuit 340 may generate the buffer enable signal RX_ON the logic level of which is enabled to a logic high level because the first to fourth strobe sampling signals ST<1:4> have the same logic level combination as the first to fourth mode sampling signals MT<1:4> and the first to fourth inverted strobe sampling signals SB<1:4> have the same logic level combination as the first to fourth inverted mode sampling signals MB<1:4>.

Figure 12:
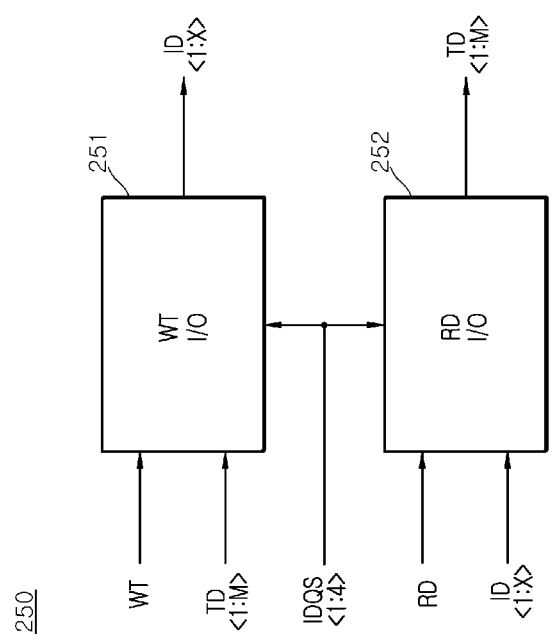
FIG. 12 is a block diagram of an example data input/output circuit in the semiconductor device of FIG. 2.

FIG. 12 is a block diagram of the example data input/output circuit 250 shown in FIG. 2. As illustrated in FIG. 12, the data input/output circuit 250 may include a write input/output circuit (WT I/O) 251 and a read input/output circuit (RD I/O) 252.

During a write operation, the write input/output circuit 251 may parallelize and latch the first to M-th transfer data TD<1:M> in synchronization with the first to fourth internal strobe signals IDQS<1:4>.

When the write signal WT is enabled during the write operation, the write input/output circuit 251 may generate the first to X-th internal data ID<1:X> from the latched first to M-th transfer data TD<1:M>.

During the write portion of a read to write operation after the read portion is completed, the write input/output circuit 251 may parallelize and latch the first to M-th transfer data TD<1:M> in synchronization with the first to fourth internal strobe signals IDQS<1:4>. When the write signal WT is enabled in the read to write operation, the write input/output circuit 251 may generate the first to X-th internal data ID<1:X> from the latched first to M-th transfer data TD<1:M>.

During a read operation, the read input/output circuit 252 may serialize and latch the first to X-th internal data ID<1:X> in synchronization with the first to fourth internal strobe signals IDQS<1:4>. When the read signal RD is enabled during the read operation, the read input/output circuit 252 may generate the first to M-th transfer data TD<1:M> based on the latched first to X-th internal data ID<1:X>.

During the read portion of a read to write operation, the read input/output circuit 252 may serialize and latch the first to X-th internal data ID<1:X> in synchronization with the first to fourth internal strobe signals IDQS<1:4>. When the read signal RD is enabled in the read to write operation, the read input/output circuit 252 may generate the first to M-th transfer data TD<1:M> based on the latched first to X-th internal data ID<1:X>.

Figure 13:
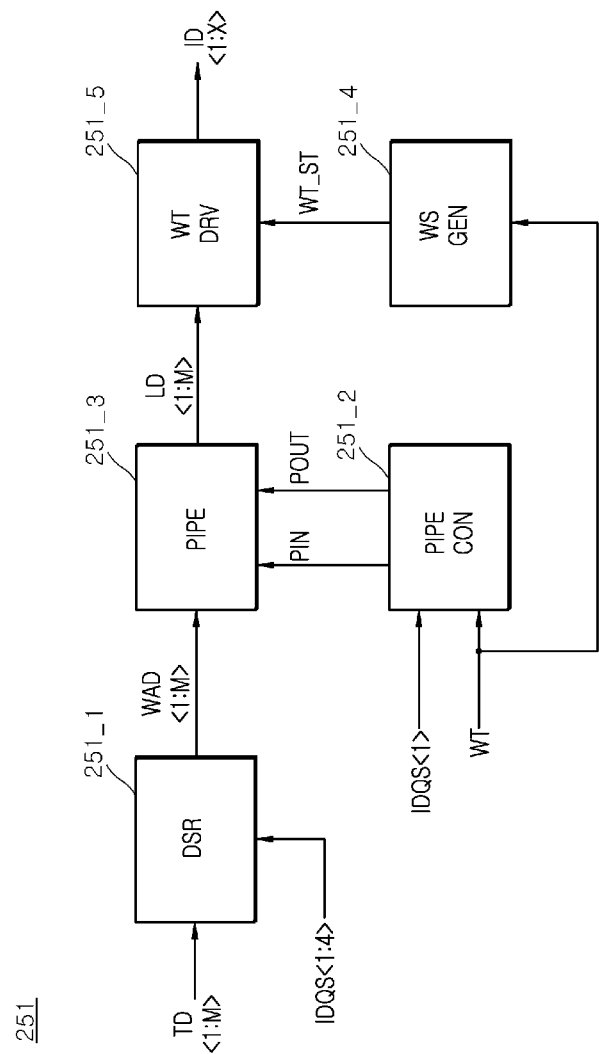
FIG. 13 is a block diagram of an example write input/output circuit in the data input/output circuit of FIG. 12.

FIG. 13 is a block diagram of the example write input/output circuit 251 shown in FIG. 12. As illustrated in FIG. 13, the write input/output circuit 251 may include a parallel control circuit (DSR) 251_1, a pipe control circuit (PIPE CON) 251_2, a pipe circuit (PIPE) 251_3, a write start signal generation circuit (WS GEN) 251_4, and a write driver (WT DRV) 251_5.

The parallel control circuit 251_1 may generate first to M-th write alignment data WAD<1:M> by parallelizing the first to M-th transfer data TD<1:M> that are serially input in synchronization with the first to fourth internal strobe signals IDQS<1:4>. The parallel control circuit 251_1 may be implemented as a common deserializer.

The pipe control circuit 251_2 may generate a pipe input control signal PIN that is enabled when the first internal strobe signal IDQS<1> is input. The pipe control circuit 251_2 may have been implemented to generate the pipe input control signal PIN when the first internal strobe signal IDQS<1> is input, but may be implemented to generate the pipe input control signal PIN when any one of the first to fourth internal strobe signals IDQS<1:4> is input. The pipe control circuit 251_2 may generate a pipe output control signal POUT based on the write signal WT. The pipe control circuit 251_2 may generate the pipe output control signal POUT that is enabled by delaying the write signal WT.

The pipe circuit 251_3 may store the first to M-th write alignment data WAD<1:M> when the pipe input control signal PIN is enabled. The pipe circuit 251_3 may output, as first to M-th latch data LD<1:M>, the first to M-th write alignment data WAD<1:M> that are stored when the pipe output control signal POUT is enabled. The pipe circuit 251_3 may have been illustrated as being controlling the pipe input control signal PIN and the pipe output control signal POUT, but may be implemented as a common pipe circuit for storing the first to M-th write alignment data WAD<1:M> and generating the first to M-th latch data LD<1:M> by receiving multiple pipe input control signals PIN and multiple pipe output control signals POUT.

The write start signal generation circuit 251_4 may generate a write start signal WT_ST by delaying the write signal WT. The write start signal generation circuit 251_4 may be implemented as a common delay circuit for delaying the write signal WT based on the amount of internal latency.

The write driver 251_5 may generate the first to X-th internal data ID<1:X> based on the first to M-th latch data LD<1:M> when the write start signal WT_ST is enabled. The write driver 251_5 may be implemented as a common driver for driving the first to X-th internal data ID<1:X> based on logic levels of the first to M-th latch data LD<1:M> when the write start signal WS_ST is enabled.

Figure 14:
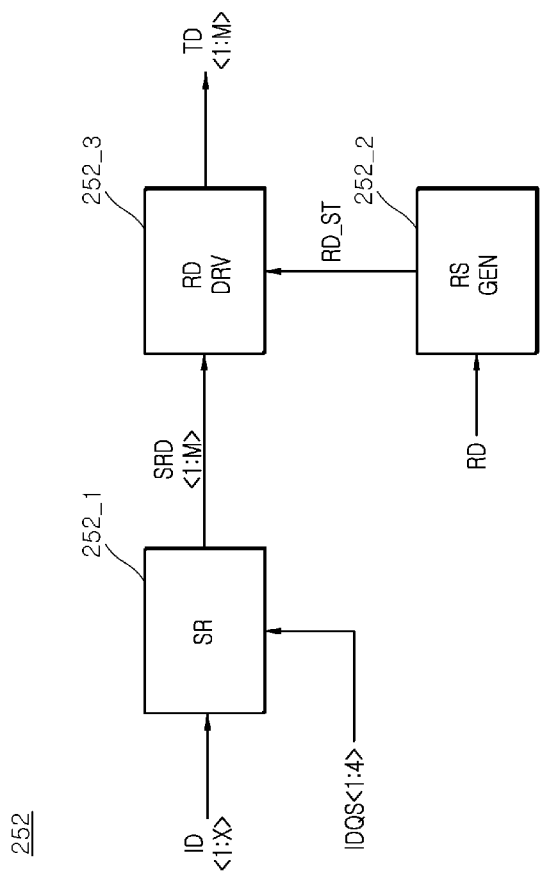
FIG. 14 is a block diagram of an example read input/output circuit in the data input/output circuit of FIG. 12.

FIG. 14 is a block diagram of the example read input/output circuit 252 shown in FIG. 12. As illustrated in FIG. 14, the read input/output circuit 252 may include a serial control circuit (SR) 252_1, a read start signal generation circuit (RS GEN) 252_2, and a read driver (RD DRV) 252_3.

The serial control circuit 252_1 may generate first to M-th serial read data SRD<1:M> by serializing the first to X-th internal data ID<1:X> that are input in parallel in synchronization with the first to fourth internal strobe signals IDQS<1:4>. The serial control circuit 252_1 may be implemented as a common serializer.

The read start signal generation circuit 252_2 may generate a read start signal RD_ST by delaying the read signal RD. The read start signal generation circuit 252_2 may be implemented as a common delay circuit for delaying the read signal RD based on the amount of internal latency.

The read driver 252_3 may generate the first to M-th transfer data TD<1:M> based on the first to M-th serial read data SRD<1:M> when the read start signal RD_ST is enabled. The read driver 252_3 may be implemented as a common driver for driving the first to M-th transfer data TD<1:M> based on logic levels of the first to M-th serial read data SRD<1:M> when the read start signal RD_ST is enabled.

Figure 15:
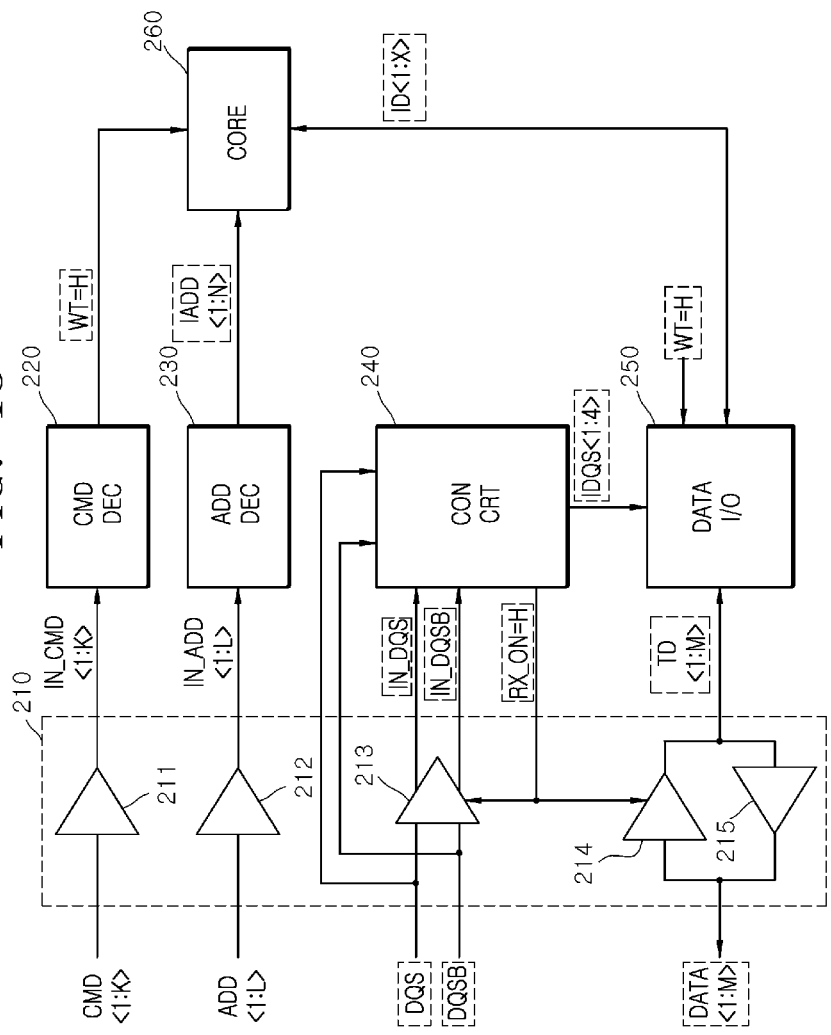
FIG. 15 is the block diagram of FIG. 2 with denoted signal levels for an example write operation according to an embodiment of the present disclosure.

FIG. 15 shows the block diagram of FIG. 2 with denoted signal levels for an example write operation according to an embodiment of the present disclosure. An operation of storing the first to M-th data DATA<1:M> by detecting patterns of the strobe signal DQS and the inverted strobe signal DQSB is described as follows.

The first buffer 211 may generate the first to K-th input commands IN_CMD<1:K> by receiving the first to K-th commands CMD<1:K> having a logic level combination for performing a write operation.

The second buffer 212 may generate the first to L-th input addresses IN_ADD<1:L> by receiving the first to L-th addresses ADD<1:L>.

The command decoder 220 may generate the write signal WT the logic level of which is enabled to a logic high level by decoding the first to K-th input commands IN_CMD<1:K> the logic levels of which are input as a logic level combination for performing the write operation.

The address decoder 230 may generate the first to N-th internal addresses IADD<1:N> by decoding the first to L-th input addresses IN_ADD<1:L>.

The control circuit 240 may generate the buffer enable signal RX_ON the logic level of which is enabled to a logic high level when patterns of the strobe signal DQS and the inverted strobe signal DQSB are preset patterns after the start of the write operation.

The third buffer 213 may generate the input strobe signal IN_DQS and the inverted input strobe signal IN_DQSB that are periodically toggled by receiving the strobe signal DQS and the inverted strobe signal DQSB when the buffer enable signal RX_ON is enabled.

The fourth buffer 214 may generate the first to M-th transfer data TD<1:M> by receiving the first to M-th data DATA<1:M> when the buffer enable signal RX_ON is enabled.

The control circuit 240 may generate the first to fourth internal strobe signals IDQS<1:4> by dividing the frequencies of the input strobe signal IN_DQS and the inverted input strobe signal IN_DQSB.

The data input/output circuit 250 may parallelize and latch the first to M-th transfer data TD<1:M> in synchronization with the first to fourth internal strobe signals IDQS<1:4> after the start of the write operation. The data input/output circuit 250 may generate the first to X-th internal data ID<1:X> from the first to M-th transfer data TD<1:M> that are latched when the logic level of the write signal WT is enabled to a logic high level after the start of the write operation.

The core circuit 260 may store the first to X-th internal data ID<1:X> in a memory cell (not illustrated) that is selected by the first to N-th internal addresses IADD<1:N> when the logic level of the write signal WT is enabled to a logic high level after the start of the write operation.

Figure 16:
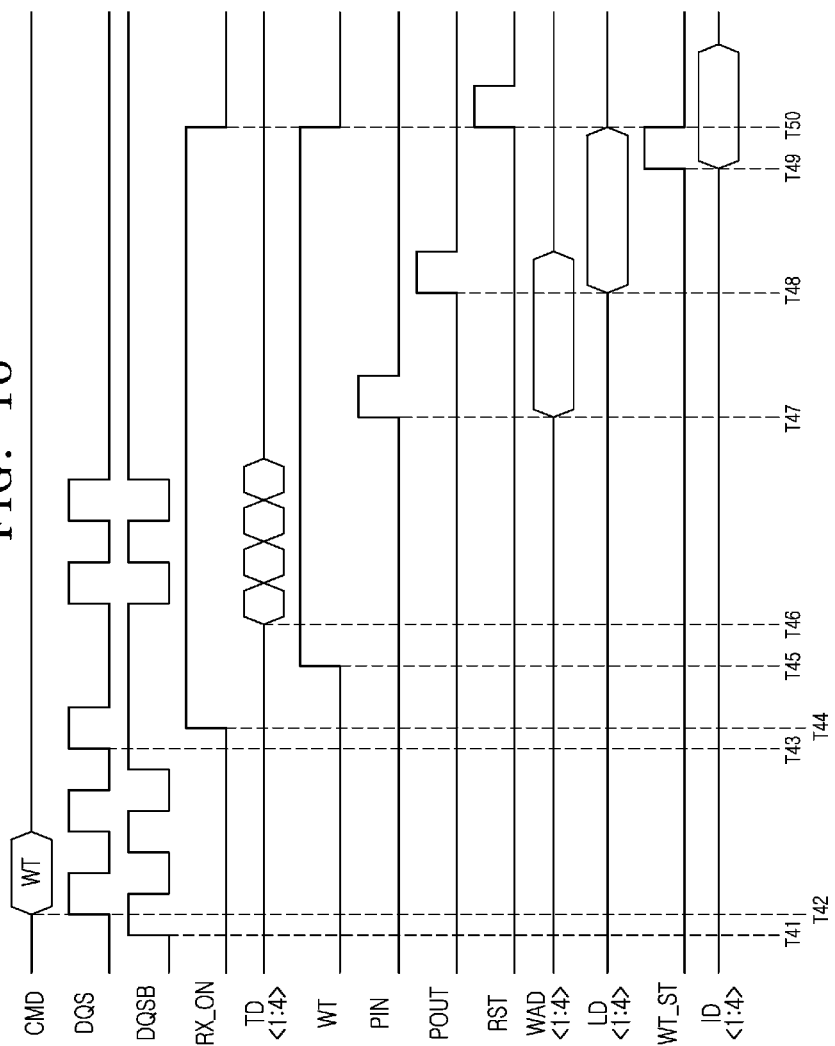
FIG. 16 is a timing diagram for the example write operation performed by the block diagram in FIG. 15.

FIG. 16 is a timing diagram of a write operation of the semiconductor system performed by the circuitry in FIG. 15, according to an embodiment of the present disclosure. Please note that not all signals described below may be shown in FIG. 16.

Specifically, an example operation of storing first to fourth data DATA<1:4> by detecting patterns of the strobe signal DQS and the inverted strobe signal DQSB is described. Components disclosed in the description of FIG. 16 may be similar to the components disclosed in FIGS. 1 to 15.

From time T41 to time T43, the controller 10 may output the strobe signal DQS and the inverted strobe signal DQSB with preset patterns. The preset patterns of the strobe signal DQS and the inverted strobe signal DQSB may be the example patterns illustrated in FIG. 9.

At time T42, the controller 10 may output the command CMD for performing a write operation.

After recognizing the patterns of the strobe signal DQS and the inverted strobe signal DQSB as the preset patterns, the control circuit 240 may generate the buffer enable signal RX_ON at time T44.

The third buffer 213 may be turned on when the logic level of the buffer enable signal RX_ON is enabled to a logic high level.

The fourth buffer 214 may be turned on when the logic level of the buffer enable signal RX_ON is enabled to a logic high level.

At time T45, the command decoder 220 may generate the write signal WT the logic level of which is enabled to a logic high level by decoding the first to K-th input commands IN_CMD<1:K> that are generated from the command CMD.

At time T46, the controller 10 may output the strobe signal DQS and the inverted strobe signal DQSB that are periodically toggled. The controller 10 may output the first to fourth data DATA<1:4> for performing the write operation.

The third buffer 213 may generate the input strobe signal IN_DQS and the inverted input strobe signal IN_DQSB by receiving the strobe signal DQS and the inverted strobe signal DQSB.

The fourth buffer 214 may generate the first to fourth transfer data TD<1:4> by receiving the first to fourth data DATA<1:4> that are serially input.

The control circuit 240 may generate the first to fourth internal strobe signals IDQS<1:4> by dividing the frequencies of the input strobe signal IN_DQS and the inverted input strobe signal IN_DQSB.

At time T47, the parallel control circuit 251_1 of the write input/output circuit 251 may generate the first to fourth write alignment data WAD<1:4> by parallelizing the first to fourth transfer data TD<1:4> that are serially input in synchronization with the first to fourth internal strobe signals IDQS<1:4>.

Also at time T47, the pipe control circuit 251_2 of the write input/output circuit 251 may generate the pipe input control signal PIN the logic level of which is enabled to a logic high level when the first internal strobe signal IDQS<1> is input.

The pipe circuit 251_3 of the write input/output circuit 251 may store the first to fourth write alignment data WAD<1:4> when the logic level of the pipe input control signal PIN is enabled to a logic high level.

At time T48, the pipe control circuit 251_2 of the write input/output circuit 251 may generate the pipe output control signal POUT the logic level of which is enabled to a logic high level based on the write signal WT having a logic high level.

The pipe circuit 251_3 of the write input/output circuit 251 may output, as the first to fourth latch data LD<1:4>, the first to fourth write alignment data WAD<1:4> that are stored when the logic level of the pipe output control signal POUT is enabled to a logic high level.

At time T49, the write start signal generation circuit 251_4 of the write input/output circuit 251 may generate the write start signal WT_ST the logic level of which is enabled to a logic high level by delaying the write signal WT.

The write driver 251_5 of the write input/output circuit 251 may generate the first to fourth internal data ID<1:4> based on the first to fourth latch data LD<1:4> when the logic level of the write start signal WT_ST is enabled to a logic high level.

The core circuit 260 may store the first to fourth internal data ID<1:4> in a memory cell (not illustrated) that is selected by the first to N-th internal addresses IADD<1:N> when the logic level of the write signal WT is enabled to a logic high level.

At time T50, the reset signal generation circuit 311 of the setting circuit 310 may generate the reset signal RST that includes a pulse that is generated when the write signal WT is disabled.

When the reset signal RST pulse is received, the sampling circuit 320 may initialize the first to fourth strobe sampling signals ST<1:4> and the first to fourth inverted strobe sampling signals SB<1:4>.

Accordingly, the semiconductor system 1 according to an embodiment of the present disclosure can reduce write latency for a write operation by detecting patterns of the strobe signal and the inverted strobe signal regardless of the input of the command for performing a write operation. Therefore, it can be seen that the semiconductor system 1 can improve operating efficiency of the semiconductor system 1 by reducing write latency after the start of a write operation.

Figure 17:
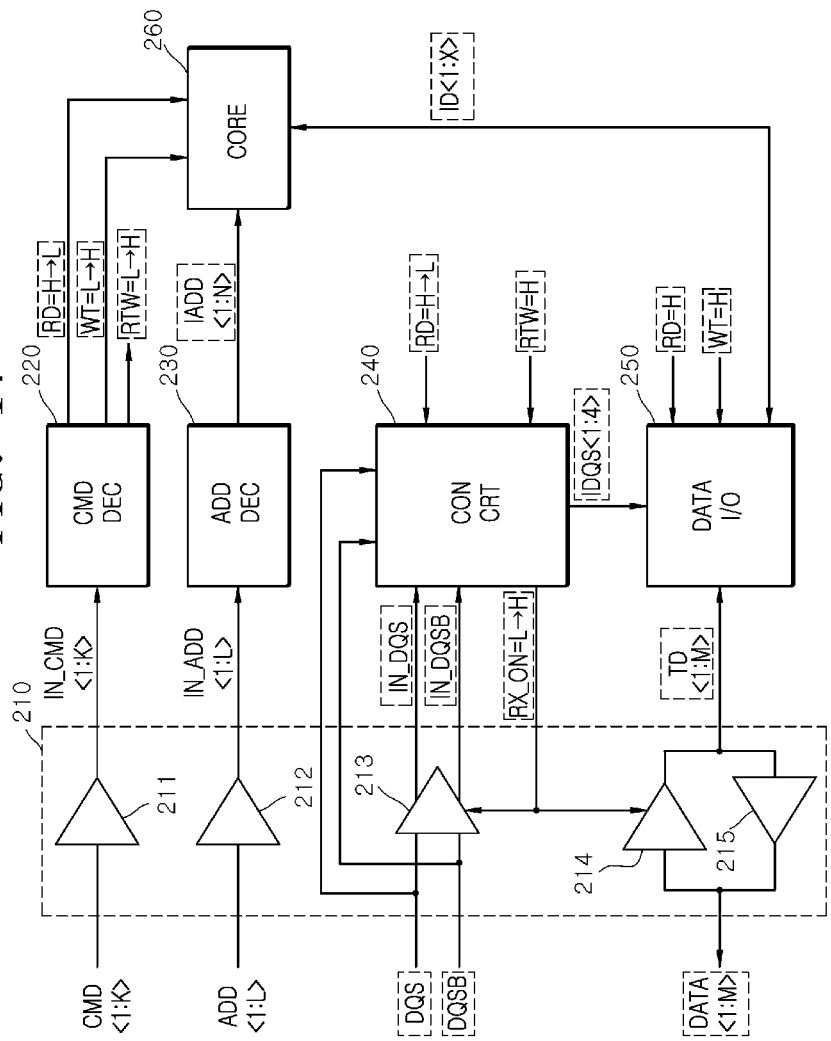
FIG. 17 is the block diagram of FIG. 2 with denoted signal levels for an example read to write operation according to an embodiment of the present disclosure.

FIG. 17 shows the block diagram of FIG. 2 with denoted signal levels for an example read to write operation according to an embodiment of the present disclosure. An operation of outputting the first to M-th data DATA<1:M> by performing a read operation and then storing the first to M-th data DATA<1:M> by performing a write operation is described as follows.

The first buffer 211 may generate the first to K-th input commands IN_CMD<1:K> by receiving the first to K-th commands CMD<1:K> having a logic level combination for performing a read to write operation.

The second buffer 212 may generate the first to L-th input addresses IN_ADD<1:L> by receiving the first to L-th addresses ADD<1:L>.

The command decoder 220 may generate the read signal RD the logic level of which is enabled to a logic high level, the write signal WT the logic level of which is disabled to a logic low level, and the read to write signal RTW the logic level of which is disabled to a logic low level by decoding the first to K-th input commands IN_CMD<1:K> the logic levels of which are input as a logic level combination for performing a read operation.

The address decoder 230 may generate the first to N-th internal addresses IADD<1:N> by decoding the first to L-th input addresses IN_ADD<1: L>.

The core circuit 260 may output the first to X-th internal data ID<1:X> that have been stored in a memory cell (not illustrated) that is selected by the first to N-th internal addresses IADD<1:N>, when the logic level of the read signal RD is enabled to a logic high level after the start of the read to write operation.

The data input/output circuit 250 may generate the first to M-th transfer data TD<1:M> based on the first to X-th internal data ID<1:X> that are latched when the logic level of the read signal RD is enabled to a logic high level.

The fifth buffer 215 may generate the first to M-th data DATA<1:M> by receiving the first to M-th transfer data TD<1:M>, and may output the first to M-th data DATA<1:M> to the controller 10.

The control circuit 240 may generate the buffer enable signal RX_ON the logic level of which is disabled to a logic low level when the read signal RD is enabled after the start of the read to write operation.

The third buffer 213 may be turned off when the logic level of the buffer enable signal RX_ON is disabled to a logic low level.

The fourth buffer 214 may be turned off when the logic level of the buffer enable signal RX_ON is disabled to a logic low level.

The command decoder 220 may generate the read signal RD the logic level of which is disabled to a logic low level, the write signal WT the logic level of which is enabled to a logic high level, and the read to write signal RTW the logic level of which is enabled to a logic high level by decoding the first to K-th input commands IN_CMD<1:K> the logic levels of which are input as a logic level combination for performing a write operation.

The address decoder 230 may generate the first to N-th internal addresses IADD<1:N> by decoding the first to L-th input addresses IN_ADD<1:L>.

The control circuit 240 may generate the buffer enable signal RX_ON the logic level of which is enabled to a logic high level when the read signal RD is disabled for the interval in which the logic level of the read to write signal RTW is enabled to a logic high level after the start of the read to write operation.

The third buffer 213 may generate the input strobe signal IN_DQS and the inverted input strobe signal IN_DQSB that are periodically toggled by receiving the strobe signal DQS and the inverted strobe signal DQSB when the buffer enable signal RX_ON is enabled.

The fourth buffer 214 may generate the first to M-th transfer data TD<1:M> by receiving the first to M-th data DATA<1:M> when the buffer enable signal RX_ON is enabled.

The control circuit 240 may generate the first to fourth internal strobe signals IDQS<1:4> by dividing the frequencies of the input strobe signal IN_DQS and the inverted input strobe signal IN_DQSB.

The data input/output circuit 250 may parallelize and latch the first to M-th transfer data TD<1:M> in synchronization with the first to fourth internal strobe signals IDQS<1:4> after the start of the write operation. The data input/output circuit 250 may generate the first to X-th internal data ID<1:X> from the latched first to M-th transfer data TD<1:M> when the logic level of the write signal WT is enabled to a logic high level after the start of the write operation.

The core circuit 260 may store the first to X-th internal data ID<1:X> in a memory cell (not illustrated) that is selected by the first to N-th internal addresses IADD<1:N> when the logic level of the write signal WT is enabled to a logic high level after the start of the write operation.

Figure 18:
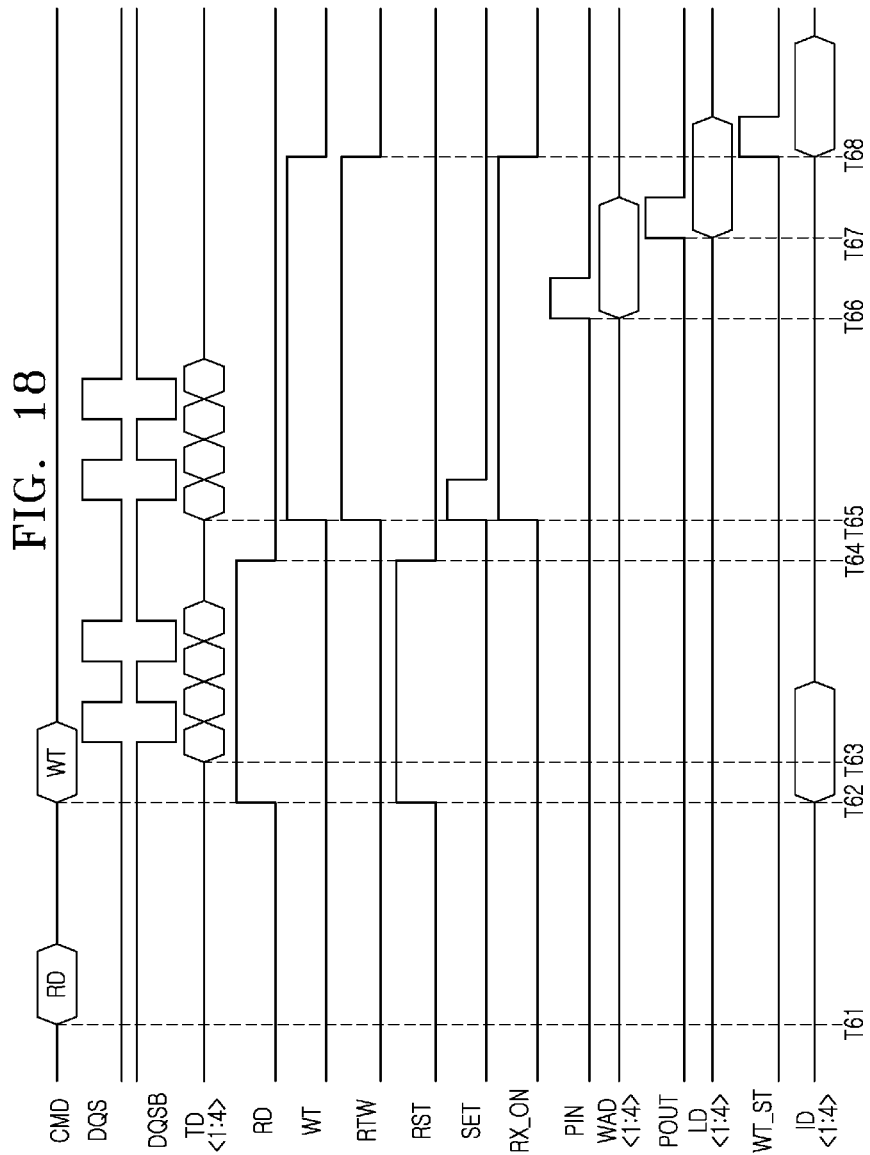
FIG. 18 is a timing diagram for the example read to write operation performed by the circuitry in FIG. 17.

FIG. 18 is a timing diagram for a read to write operation performed by the circuitry in FIG. 17, according to an embodiment of the present disclosure. Please note that not all signals described below may be shown in FIG. 18.

Specifically, an example operation of storing first to fourth data DATA<1:4> after completing a read command to read the first to fourth data DATA<1:4> is described as follows as an example. Components disclosed in the description of FIG. 18 may be similar to the components disclosed in FIGS. 1 to 17.

At time T61, the controller 10 may output the command CMD for performing a read operation to the first buffer 211, which may then output the first to K-th input command IN_CMD<1:K>.

At time T62, the command decoder 220 may generate the read signal RD the logic level of which is enabled to a logic high level by decoding the first to K-th input commands IN_CMD<1:K> that are generated from the command CMD.

Also at time T62, the controller 10 may output the command CMD for performing a write operation. The setting circuit 310 may generate the reset signal RST that includes a pulse the logic level of which is generated as a logic high level when the read signal RD is enabled. The sampling circuit 320 may generate the first to fourth strobe sampling signals ST<1:4> and the first to fourth inverted strobe sampling signals SB<1:4> that are initialized when the pulse of the reset signal RST is input.

Also at time T62, the core circuit 260 may output the first to fourth internal data ID<1:4> that have been stored in a memory cell (not illustrated) that is selected by the first to N-th internal addresses IADD<1:N> when the logic level of the read signal RD is enabled to a logic high level.

At time T63, the read input/output circuit 252 may serialize and latch the first to fourth internal data ID<1:4> in synchronization with the first to fourth internal strobe signals IDQS<1:4>. The read input/output circuit 252 may generate the first to fourth transfer data TD<1:4> based on the latched the first to fourth internal data ID<1:4> when the logic level of the read signal RD is enabled to a logic high level.

At time T64, the command decoder 220 may generate the read signal RD the logic level of which is disabled to a logic low level.

At time T65, the command decoder 220 may assert the write signal WT and the read to write signal RTW.

Also at time T65, the setting circuit 310 may generate the set signal SET that includes a pulse the logic level of which is generated as a logic high level when the logic level of the read signal RD is disabled to a logic low level for the interval in which the read to write signal RTW is enabled.

Also at time T65, the comparison circuit 340 may generate the buffer enable signal RX_ON the logic level of which is enabled to a logic high level when the logic level of the pulse of the set signal SET is input as a logic high level.

Accordingly, the third buffer 213 may be turned on when the logic level of the buffer enable signal RX_ON is enabled to a logic high level, and may generate the input strobe signal IN_DQS and the inverted input strobe signal IN_DQSB by receiving the strobe signal DQS and the inverted strobe signal DQSB.

The control circuit 240 may generate the first to fourth internal strobe signals IDQS<1:4> by dividing the frequencies of the input strobe signal IN_DQS and the inverted input strobe signal IN_DQSB.

The fourth buffer 214 may be turned on when the logic level of the buffer enable signal RX_ON is enabled to a logic high level, and may generate the first to fourth transfer data TD<1:4> by receiving the first to fourth data DATA<1:4> that are serially input.

At time T66, the parallel control circuit 251_1 of the write input/output circuit 251 may generate the first to fourth write alignment data WAD<1:4> by parallelizing the first to fourth transfer data TD<1:4> that are serially input in synchronization with the first to fourth internal strobe signals IDQS<1:4>.

Also at time T66, the pipe control circuit 251_2 of the write input/output circuit 251 may generate the pipe input control signal PIN the logic level of which is enabled to a logic high level when the first internal strobe signal IDQS<1> is input.

The pipe circuit 251_3 of the write input/output circuit 251 may store the first to fourth write alignment data WAD<1:4> when the logic level of the pipe input control signal PIN is enabled to a logic high level.

At time T67, the pipe control circuit 251_2 of the write input/output circuit 251 may generate the pipe output control signal POUT the logic level of which is enabled to a logic high level based on the write signal WT having a logic high level.

The pipe circuit 251_3 of the write input/output circuit 251 may output, as the first to fourth latch data LD<1:4>, the first to fourth write alignment data WAD<1:4> that have been stored when the logic level of the pipe output control signal POUT is enabled to a logic high level.

At time T68, the write start signal generation circuit 251_4 of the write input/output circuit 251 may generate the write start signal WT_ST the logic level of which is enabled to a logic high level by delaying the write signal WT.

The write driver 251_5 of the write input/output circuit 251 may generate the first to fourth internal data ID<1:4> based on the first to fourth latch data LD<1:4> when the logic level of the write start signal WT_ST is enabled to a logic high level.

The core circuit 260 may store the first to fourth internal data ID<1:4> in a memory cell (not illustrated) that is selected by the first to N-th internal addresses IADD<1:N> when the logic level of the write signal WT is enabled to a logic high level.

Accordingly, it can be seen that an embodiment of the semiconductor system 1 may reduce write latency for a write operation by immediately receiving data for a write operation after performing a read operation in a read to write operation.

Figure 19:
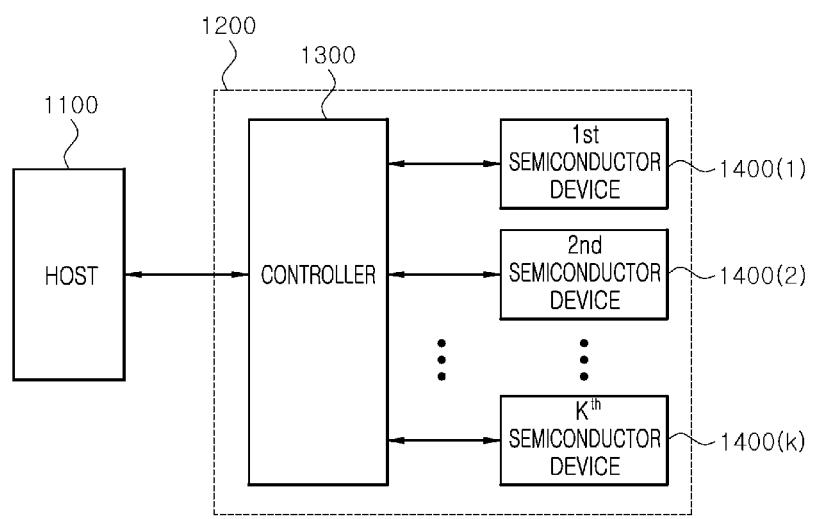
FIG. 19 is a block diagram of an electronic system comprising the semiconductor device and the semiconductor system illustrated in FIGS. 1 to 18 in accordance with an embodiment of the disclosure.

FIG. 19 is a block diagram illustrating a construction according to an embodiment of an electronic system 1000 according to an embodiment of the present disclosure. As illustrated in FIG. 19, the electronic system 1000 may include a host 1100 and a semiconductor system 1200.

The host 1100 and the semiconductor system 1200 may mutually transmit signals by using an interface protocol. The interface protocol that is used between the host 1100 and the semiconductor system 1200 may include a multi-media card (MMC), an enhanced small disk interface (ESDI), integrated drive electronics (IDE), peripheral component interconnect—express (PCI-E), advanced technology attachment (ATA), serial ATA (SATA), parallel ATA (PATA), a serial attached SCSI (SAS), a universal serial bus (USB), etc.

The semiconductor system 1200 may include a controller 1300 and semiconductor devices 1400(K:1). The controller 1300 may control operations of the semiconductor devices 1400(K:1). Each of the semiconductor devices 1400(K:1) can reduce write latency for a write operation in a way to receive data by detecting patterns of the strobe signal and the inverted strobe signal regardless of the input of the command for performing the write operation after the start of the write operation. Each of the semiconductor devices 1400(K:1) can improve operating efficiency of the semiconductor system 1200 because an additional command can be input by reducing write latency for receiving data from timing at which the command for performing a write operation is input after the start of the write operation. Each of the semiconductor devices 1400(K:1) can reduce write latency for a write operation by immediately receiving data for performing the write operation after performing a read operation after the start of a read to write operation. Each of the semiconductor devices 1400(K:1) can improve operating efficiency of the semiconductor system 1200 because an additional command can be input by immediately receiving data for performing a write operation after performing a read operation after the start of a read to write operation.

The controller 1300 may be implemented as the controller 10 illustrated in FIG. 1. Each of the semiconductor devices 1400(K:1) may be implemented as the semiconductor device 20 illustrated in FIG. 1. In different embodiments, each of the semiconductor devices 1400(K:1) may be implemented as one of dynamic random access memory (DRAM), phase change random access memory (PRAM), resistive random access memory (RRAM), magnetic random access memory (MRAM), and ferroelectric random access memory (FRAM).

What is claimed is:

1. A semiconductor device comprising:
   a control circuit configured to generate a buffer enable signal that is enabled when patterns of a strobe signal and an inverted strobe signal match preset patterns after a start of a write operation and configured to generate an internal strobe signal by dividing frequencies of an input strobe signal and an inverted input strobe signal; and
   a buffer circuit configured to generate the input strobe signal and the inverted input strobe signal from the strobe signal and the inverted strobe signal that are received when the buffer enable signal is enabled and configured to generate transfer data by receiving data for performing the write operation when the buffer enable signal is enabled.

2. The semiconductor device of claim 1, wherein the preset patterns are set as a logic level combination obtained by sequentially sampling logic levels of the strobe signal that are input at rising edges of the inverted strobe signal and a logic level combination obtained by sequentially sampling logic levels of the inverted strobe signal that are input at rising edges of the strobe signal.

3. The semiconductor device of claim 1, wherein the control circuit comprises:
- a write strobe signal generation circuit configured to generate a write strobe signal and an inverted write strobe signal by buffering the strobe signal and the inverted strobe signal;
- a detection circuit configured to generate the buffer enable signal by detecting logic level combinations of the write strobe signal and the inverted write strobe signal that are sequentially input when a write signal is enabled; and
- a division circuit configured to generate the internal strobe signal by dividing the frequencies of the input strobe signal and the inverted input strobe signal.

4. The semiconductor device of claim 3, wherein the detection circuit comprises:
- a setting circuit configured to generate a reset signal that comprises a pulse that is generated after the write signal is enabled;
- a sampling circuit configured to generate a strobe sampling signal by sequentially sampling logic levels of the write strobe signal that are input at rising edges of the inverted write strobe signal and configured to generate an inverted strobe sampling signal by sequentially sampling logic levels of the inverted write strobe signal that are input at rising edges of the write strobe signal; and
- a comparison circuit configured to generate the buffer enable signal by comparing logic level combinations of the strobe sampling signal and the inverted strobe sampling signal and a mode sampling signal and an inverted mode sampling signal and configured to disable the buffer enable signal when the reset signal is enabled.

5. The semiconductor device of claim 4, wherein the mode sampling signal and the inverted mode sampling signal are input in a form of the preset patterns.

6. The semiconductor device of claim 4, wherein the sampling circuit comprises:
- a strobe sampling signal generation circuit configured to generate the strobe sampling signal by sequentially sampling the logic levels of the write strobe signal that are input at the rising edges of the inverted write strobe signal and configured to initialize the strobe sampling signal when the reset signal is input; and
- an inverted strobe sampling signal generation circuit configured to generate the inverted strobe sampling signal by sequentially sampling the logic levels of the inverted write strobe signal that are input at the rising edges of the write strobe signal and configured to initialize the inverted strobe sampling signal when the reset signal is input.

7. The semiconductor device of claim 4, wherein the comparison circuit comprises:
- a first comparison signal generation circuit configured to generate a first comparison signal that is enabled when logic level combinations of the strobe sampling signal and the mode sampling signal are identical with each other;
- a second comparison signal generation circuit configured to generate a second comparison signal that is enabled when logic level combinations of the inverted strobe sampling signal and the inverted mode sampling signal are identical with each other; and
- a buffer enable signal generation circuit configured to generate the buffer enable signal that is enabled when both the first comparison signal and the second comparison signal are enabled and that is disabled when the reset signal is enabled.

8. The semiconductor device of claim 1, further comprising:
- a write input/output circuit configured to align the transfer data in synchronization with the internal strobe signal and configured to generate internal data from the aligned transfer data; and
- a core circuit configured to store the internal data based on a write signal and an internal address that are enabled to after the start of the write operation.

9. The semiconductor device of claim 8, wherein the write input/output circuit comprises:
- a parallel control circuit configured to generate write alignment data by parallelizing the transfer data that is serially input in synchronization with the internal strobe signal;
- a pipe control circuit configured to generate a pipe input control signal that is enabled when the internal strobe signal is input and configured to generate a pipe output control signal that is enabled when the write signal is input;
- a pipe circuit configured to store the write alignment data when the pipe input control signal is enabled and configured to output, as latch data, the write alignment data that is stored in the pipe circuit when the pipe output control signal is enabled;
- a write start signal generation circuit configured to generate a write start signal by delaying the write signal; and
- a write driver configured to generate the internal data based on the latch data when the write start signal is enabled.

10. A semiconductor system comprising:
- a controller configured to output a strobe signal and an inverted strobe signal after a start of a write operation and configured to output data; and
- a semiconductor device configured to generate a buffer enable signal that is enabled when patterns of the strobe signal and the inverted strobe signal match preset patterns, configured to generate an internal strobe signal by receiving the strobe signal and the inverted strobe signal when the buffer enable signal is enabled, configured to receive the data when the buffer enable signal is enabled, and configured to store the data that is received in synchronization with the internal strobe signal.

11. The semiconductor system of claim 10, wherein the controller is configured to output the data after outputting the strobe signal and the inverted strobe signal in a form of the preset patterns after the start of the write operation.

12. The semiconductor system of claim 10, wherein the strobe signal and the inverted strobe signal are signals that are periodically toggled in order to strobe the data after being generated in the form of the preset patterns for performing the write operation.

13. The semiconductor system of claim 10, wherein the semiconductor device comprises:
- a control circuit configured to generate the buffer enable signal that is enabled when the patterns of the strobe signal and the inverted strobe signal match the preset patterns and configured to generate the internal strobe signal by dividing frequencies of an input strobe signal and an inverted input strobe signal that are generated from the strobe signal and the inverted strobe signal;

a buffer circuit comprising multiple buffers and configured to generate the input strobe signal and the inverted input strobe signal by receiving the strobe signal and the inverted strobe signal when the buffer enable signal is enabled and configured to generate transfer data by receiving the data when the buffer enable signal is enabled; and a write input/output circuit configured to generate internal data to be stored in a core circuit by aligning and latching the transfer data in synchronization with the internal strobe signal.

14. The semiconductor system of claim 13, wherein the control circuit comprises:

a write strobe signal generation circuit configured to generate a write strobe signal and an inverted write strobe signal by buffering the strobe signal and the inverted strobe signal;

a detection circuit configured to generate the buffer enable signal by detecting logic level combinations of the write strobe signal and the inverted write strobe signal that are sequentially input when a write signal is enabled; and a division circuit configured to generate the internal strobe signal by dividing the frequencies of the input strobe signal and the inverted input strobe signal.

15. The semiconductor system of claim 14, wherein the detection circuit comprises:

a setting circuit configured to generate a reset signal that comprises a pulse that is generated after the write signal is enabled;

a sampling circuit configured to generate a strobe sampling signal by sequentially sampling logic levels of the write strobe signal that are input at rising edges of the inverted write strobe signal and configured to generate an inverted strobe sampling signal by sequentially sampling logic levels of the inverted write strobe signal that are input at rising edges of the write strobe signal; and a comparison circuit configured to generate the buffer enable signal by comparing logic level combinations of the strobe sampling signal and the inverted strobe sampling signal and a mode sampling signal and an inverted mode sampling signal and configured to disable the buffer enable signal when the reset signal is enabled.

16. The semiconductor system of claim 15, wherein the sampling circuit comprises:

a strobe sampling signal generation circuit configured to generate the strobe sampling signal by sequentially sampling the logic levels of the write strobe signal that are input at the rising edges of the inverted write strobe signal and configured to initialize the strobe sampling signal when the reset signal is input; and an inverted strobe sampling signal generation circuit configured to generate the inverted strobe sampling signal by sequentially sampling the logic levels of the inverted write strobe signal that are input at the rising edges of the write strobe signal and configured to initialize the inverted strobe sampling signal when the reset signal is input.

17. The semiconductor system of claim 15, wherein the comparison circuit comprises:

a first comparison signal generation circuit configured to generate a first comparison signal that is enabled when logic level combinations of the strobe sampling signal and the mode sampling signal are identical with each other;

a second comparison signal generation circuit configured to generate a second comparison signal that is enabled when logic level combinations of the inverted strobe sampling signal and the inverted mode sampling signal are identical with each other; and a buffer enable signal generation circuit configured to generate the buffer enable signal that is enabled when both the first comparison signal and the second comparison signal are enabled and that is disabled when the reset signal is enabled.

18. The semiconductor system of claim 13, wherein the write input/output circuit comprises:

a parallel control circuit configured to generate write alignment data by parallelizing the transfer data that is serially input in synchronization with the internal strobe signal;

a pipe control circuit configured to generate a pipe input control signal that is enabled when the internal strobe signal is input and configured to generate a pipe output control signal that is enabled when the write signal is input;

a pipe circuit configured to store the write alignment data when the pipe input control signal is enabled and configured to output, as latch data, the write alignment data that is stored in the pipe circuit when the pipe output control signal is enabled;

a write start signal generation circuit configured to generate a write start signal by delaying the write signal; and a write driver configured to generate the internal data based on the latch data when the write start signal is enabled.

19. A semiconductor device comprising:

a control circuit configured to generate a buffer enable signal that is enabled when patterns of a strobe signal and an inverted strobe signal match preset patterns after a start of a write operation or that is enabled after a start of a read to write operation and configured to generate an internal strobe signal by dividing frequencies of an input strobe signal and an inverted input strobe signal; and a buffer circuit configured to generate the input strobe signal and the inverted input strobe signal from the strobe signal and the inverted strobe signal that are received when the buffer enable signal is enabled and configured to generate transfer data by receiving data for performing the write operation and the read to write operation when the buffer enable signal is enabled.

20. The semiconductor device of claim 19, wherein the read to write operation is set as an operation of continuously performing the write operation after performing a read operation.

21. The semiconductor device of claim 19, wherein the control circuit comprises:

a write strobe signal generation circuit configured to generate a write strobe signal and an inverted write strobe signal by buffering the strobe signal and the inverted strobe signal;

a detection circuit configured to generate the buffer enable signal by detecting logic level combinations of the write strobe signal and the inverted write strobe signal that are sequentially input when a write signal is enabled and configured to generate the buffer enable signal when the write signal is enabled for an interval in which a read to write signal is enabled; and a division circuit configured to generate the internal strobe signal by dividing the frequencies of the input strobe signal and the inverted input strobe signal.

22. The semiconductor device of claim 21, wherein the detection circuit comprises:
   a setting circuit configured to generate a set signal that comprises a pulse that is generated after a read signal is input for an interval in which the read to write signal is enabled and configured to generate a reset signal that comprises a pulse that is generated after the write signal is enabled;
   a sampling circuit configured to generate a strobe sampling signal by sequentially sampling logic levels of the write strobe signal that are input at rising edges of the inverted write strobe signal and configured to generate an inverted strobe sampling signal by sequentially sampling logic levels of the inverted write strobe signal that are input at rising edges of the write strobe signal; and
   a comparison circuit configured to generate the buffer enable signal that is enabled when the set signal is enabled or when logic level combinations of the strobe sampling signal and the inverted strobe sampling signal and a mode sampling signal and an inverted mode sampling signal are identical with each other and configured to disable the buffer enable signal when the reset signal is enabled.

23. The semiconductor device of claim 22, wherein the sampling circuit comprises:
   a strobe sampling signal generation circuit configured to generate the strobe sampling signal by sequentially sampling the logic levels of the write strobe signal that are input at the rising edges of the inverted write strobe signal and configured to initialize the strobe sampling signal when the reset signal is input; and
   an inverted strobe sampling signal generation circuit configured to generate the inverted strobe sampling signal by sequentially sampling the logic levels of the inverted write strobe signal that are input at the rising edges of the write strobe signal and configured to initialize the inverted strobe sampling signal when the reset signal is input.

24. The semiconductor device of claim 22, wherein the comparison circuit comprises:
   a first comparison signal generation circuit configured to generate a first comparison signal that is enabled when logic level combinations of the strobe sampling signal and the mode sampling signal are identical with each other;
   a second comparison signal generation circuit configured to generate a second comparison signal that is enabled when logic level combinations of the inverted strobe sampling signal and the inverted mode sampling signal are identical with each other; and
   a buffer enable signal generation circuit configured to generate the buffer enable signal that is enabled when both the first comparison signal and the second comparison signal are enabled or that is enabled when the set signal is enabled and that is disabled when the reset signal is enabled.

25. The semiconductor device of claim 19, further comprising:
   a write input/output circuit configured to align the transfer data in synchronization with the internal strobe signal after the start of the write operation and the read to write operation and configured to generate internal data from the transfer data that is aligned in the write input/output circuit; and
   a core circuit configured to store the internal data based on a write signal and an internal address that are enabled after the start of the write operation and the read to write operation.

26. The semiconductor device of claim 25, wherein the write input/output circuit comprises:
   a parallel control circuit configured to generate write alignment data by parallelizing the transfer data that is serially input in synchronization with the internal strobe signal;
   a pipe control circuit configured to generate a pipe input control signal that is enabled when the internal strobe signal is input and configured to generate a pipe output control signal that is enabled when the write signal is input;
   a pipe circuit configured to store the write alignment data when the pipe input control signal is enabled and configured to output, as latch data, the write alignment data that is stored in the pipe circuit when the pipe output control signal is enabled;
   a write start signal generation circuit configured to generate a write start signal by delaying the write signal; and
   a write driver configured to generate the internal data based on the latch data when the write start signal is enabled.

* * * * *